(12) United States Patent
Li et al.

(10) Patent No.: US 12,349,575 B2
(45) Date of Patent: Jul. 1, 2025

(54) DISPLAY PANEL, MANUFACTURE METHOD THEREFOR, AND DISPLAY DEVICE

(71) Applicant: BOE Technology Group Co., Ltd., Beijing (CN)

(72) Inventors: Wei Li, Beijing (CN); Yichi Zhang, Beijing (CN); Can Zhang, Beijing (CN); Can Wang, Beijing (CN); Lijun Yuan, Beijing (CN); Ning Cong, Beijing (CN); Jinfei Niu, Beijing (CN); Jingjing Zhang, Beijing (CN); Minghua Xuan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 541 days.

(21) Appl. No.: 17/772,595

(22) PCT Filed: May 26, 2021

(86) PCT No.: PCT/CN2021/096070
§ 371 (c)(1),
(2) Date: Apr. 28, 2022

(87) PCT Pub. No.: WO2022/246690
PCT Pub. Date: Dec. 1, 2022

(65) Prior Publication Data
US 2023/0141443 A1 May 11, 2023

(51) Int. Cl.
*H10K 59/38* (2023.01)
*H10K 59/12* (2023.01)
(Continued)

(52) U.S. Cl.
CPC ......... *H10K 59/38* (2023.02); *H10K 59/1201* (2023.02); *H10K 59/122* (2023.02); *H10K 59/80* (2023.02); *H10K 59/879* (2023.02)

(58) Field of Classification Search
CPC .. H10K 59/38; H10K 59/1201; H10K 59/122; H10K 59/80; H10K 59/879; H10K 2102/3026; H10K 2102/351
See application file for complete search history.

(56) References Cited

U.S. PATENT DOCUMENTS

| 8,937,430 B2 | 1/2015 | Toyoda et al. |
| 9,698,204 B2 | 7/2017 | Kamura et al. |
(Continued)

FOREIGN PATENT DOCUMENTS

| CN | 103681757 A | 3/2014 |
| CN | 105794322 A | 7/2016 |
(Continued)

OTHER PUBLICATIONS

Jin Cheng-long et al, "Overview of OLED Display Technology and Development Trends in Application Fields", vol. 38, No. 8, DOI:10.19695/j.cnki.cn12-1369.2020.08.79, Aug. 2020.
(Continued)

*Primary Examiner* — Fernando L Toledo
*Assistant Examiner* — Marshall Mu-Nuo Hatfield
(74) *Attorney, Agent, or Firm* — Westman, Champlin & Koehler, P.A.

(57) ABSTRACT

The present disclosure provides a display panel, having a light emitting layer, a transparent spacing layer on the light emitting layer, and a wavelength converting layer on the transparent spacing layer, wherein according to the luminance change ratios of the wavelength converting units of adjacent pixels and the light path property of the transparent spacing layer, the cross color issue in wavelength-conversion type display panels is at least partially solved by controlling the intensity proportions of the light arriving at the wavelength converting units of adjacent sub-pixels within a certain range.

29 Claims, 9 Drawing Sheets

(51) Int. Cl.
    *H10K 59/122*    (2023.01)
    *H10K 59/80*     (2023.01)

(56) References Cited

U.S. PATENT DOCUMENTS

| | | |
|---|---|---|
| 2004/0183436 A1 | 9/2004 | Ito et al. |
| 2014/0062294 A1 | 3/2014 | Toyoda et al. |
| 2016/0372528 A1 | 12/2016 | Kamura et al. |
| 2020/0035770 A1 | 1/2020 | Jiang |
| 2021/0050388 A1* | 2/2021 | Song .................. H10K 59/352 |
| 2021/0143358 A1* | 5/2021 | Son ........................ H10K 59/38 |
| 2022/0262984 A1 | 8/2022 | Choi et al. |

FOREIGN PATENT DOCUMENTS

| | | |
|---|---|---|
| CN | 109037476 A | 12/2018 |
| CN | 109119453 A | 1/2019 |
| CN | 111063826 A | 4/2020 |
| CN | 111341816 A | 6/2020 |
| CN | 111490080 A | 8/2020 |
| CN | 111564571 A | 8/2020 |
| CN | 111584754 A | 8/2020 |
| WO | WO-2013183751 A1 * | 12/2013 ....... G02F 1/133617 |
| WO | 2020230989 A1 | 11/2020 |
| WO | 0215292 A2 | 2/2022 |

OTHER PUBLICATIONS

Han Young-Joon et al., "Fabrication of Ink-jet printing Quantum-Dots Light Emitting Diodes using Optimization of Co-solvent Condition", 54-2, SID 2019 Digest.

Extended European Search Report, for European Patent Application No. 21942271.4, dated Nov. 16, 2023, 9 pages.

* cited by examiner

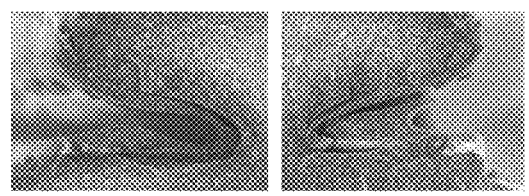
Fig. 14(c)
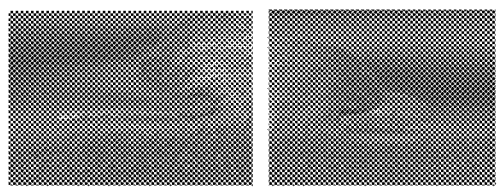
Fig. 14(d)
Fig. 14
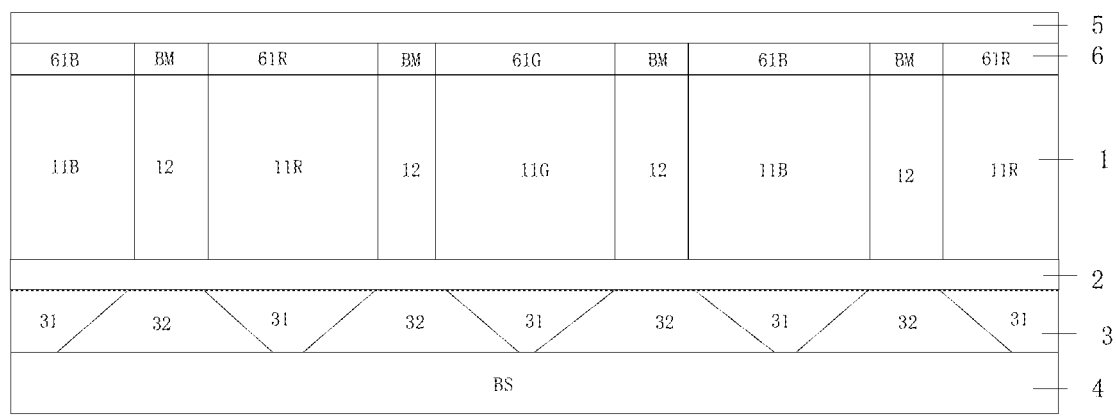
Fig. 15
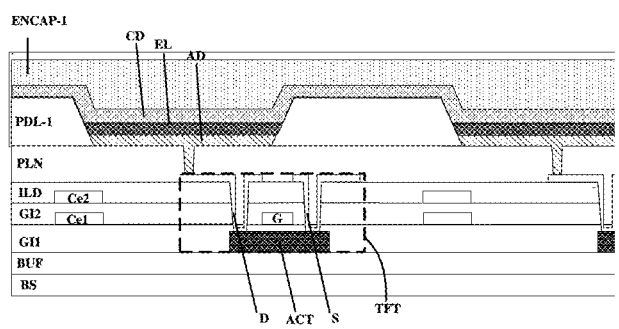
Fig. 16

DISPLAY PANEL, MANUFACTURE METHOD THEREFOR, AND DISPLAY DEVICE

CROSS-REFERENCE TO RELATED APPLICATION

This application is a Section 371 National Stage application of International Application No. PCT/CN2021/096070, filed on 26 May 2021, filed in Chinese, the content of which is hereby incorporated by reference in its entirety.

TECHNICAL FIELD

The present disclosure relates to the technical field of display, and particularly to a display panel, a manufacture method therefor and a display device.

BACKGROUND

Organic light emitting display (OLED) as an mainstream display technology has occupied the market of mobile display, and also attracts significant interest of the manufactures in the display application such as TV. From the perspective of the manner for displaying colors, the technical route of OLED is mainly divided into two types. One is to use organic light emitting materials which emit different colors respectively (such as red light emitting material, green light emitting material and blue light emitting material) to form sub-pixels with different colors, which is called the RGB type. The RGB type has a high color gamut, and has occupied the market of middle and small size applications. However, it cannot be scaled up to large area because it is limited by the fine metal mask (FMM) process. Although the RGB type where RGB OLEDs are printed by ink jet is a potential technology for large size OLED, the color gamut value is not high enough due to the limitation on the research and development of the OLED material obtained by a solution process. The other is to use a single color OLED as a backlight emitting unit in combination with color films to achieve the color display, which is called the backlight-color film type. The process in which a white backlight is combined with color films has been one of the mainstream technologies for large size OLED because it may be achieved by deposition on the entire surface with an open mask. In the white backlight-color film technology, the color films function to filter light with wavelengths other than that for the desired color from the white light. The color gamut of the color films directly limits the color gamut range of the large size OLED product.

A technology where a wavelength converting component is used to change the color of the light emitted by a single color OLED to achieve the color display has emerged. For example, a technology combining a blue OLED with quantum dots (QDs) has been proposed in related art, where the blue OLED is used as a light source to cooperate with the QDs to down-convert blue light into red light and green light, thereby achieving the color display. Such a technology is called the QD-OLED.

The development of the display panel comprising a wavelength converting component still faces many practical technical challenges. There is still a need for improving the display panel comprising a wavelength converting component, in particular a QD conversion layer.

SUMMARY

The present disclosure provides a display panel, comprising:

a light emitting layer on a base substrate,
a transparent spacing layer on the light emitting layer, and
a wavelength converting layer on the transparent spacing layer,
wherein the display panel comprises sub-pixels arranged in an array, the sub-pixels arranged in an array comprise a first sub-pixel and a second sub-pixel adjacent to each other, wherein in each of the first sub-pixel and the second sub-pixel one light emitting unit in the light emitting layer and one wavelength converting unit in the wavelength converting layer are comprised, and the light emitting unit and the wavelength converting unit are stacked and spaced apart by the transparent spacing layer,
the light emitting units of the first sub-pixel and the second sub-pixel are spaced apart by a first pixel defining layer in the light emitting layer, and have a top surface spacing of d2,
the wavelength converting unit of the first sub-pixel is a first wavelength converting unit which has a luminance change ratio of ra on light emitted by the light emitting unit, and the wavelength converting unit of the second sub-pixel is a second wavelength converting unit which has a luminance change ratio of rb on light emitted by the light emitting unit, and the wavelength converting units of the first sub-pixel and the second sub-pixel are spaced apart by a second pixel defining layer in the wavelength converting layer,
in a direction from the first sub-pixel to the second sub-pixel, relative to an orthographic projection of a boundary between a top surface of the light emitting unit of the second sub-pixel and the first pixel defining layer between the light emitting units of the first sub-pixel and the second sub-pixel on the base substrate, an orthographic projection of a boundary between a bottom surface of the second wavelength converting unit and the second pixel defining layer between the wavelength converting units of the first sub-pixel and the second sub-pixel on the base substrate is shifted by $d4_2$,
wherein
in all light which is incident into the transparent spacing layer from the top surface of the light emitting unit and may reach a top surface of the transparent spacing layer, light with an emergence angle of $\alpha_1$ or more has an intensity proportion of x1% or less, wherein $x1\% = p1 \times (ra/rb)$, wherein $p1 \leq 5\%$,
wherein when light starting from a bottom surface of the transparent spacing layer has an emergence angle of $\alpha_1$, a projection of a light path thereof through the transparent spacing layer on the base substrate has a length less than or equal to $d2+d4_2$.

Optionally, $p1 \leq 2\%$.

Optionally, when the light starting from the bottom surface of the transparent spacing layer has an emergence angle of $\alpha_1$, a difference between the length of the projection of the light path thereof through the transparent spacing layer on the base substrate and $d2+d4_2$ is less than or equal to 5 μm.

Optionally, in a direction from the second sub-pixel to the first sub-pixel, relative to an orthographic projection of a boundary between a top surface of the light emitting unit of the first sub-pixel and the first pixel defining layer between the light emitting units of the first sub-pixel and the second sub-pixel on the base substrate, an orthographic projection of a boundary between a bottom surface of the first wavelength converting unit and the second pixel defining layer between the wavelength converting units of the first sub-pixel and the second sub-pixel on the base substrate is shifted by $d4_1$, wherein in all light which is incident into the transparent spacing layer from the top surface of the light emitting unit and may reach a top surface of the transparent spacing layer, light with an emergence angle of $\alpha_2$ or more has an intensity proportion of x2% or less, wherein x2%=p2×(rb/ra), wherein p2≤5%, wherein when light from a bottom surface of the transparent spacing layer has an emergence angle of $\alpha_2$, a projection of a light path thereof through the transparent spacing layer on the base substrate has a length less than or equal to $d2+d4_1$.

Optionally, p2=p1.

Optionally, $d4_1=d4_2$.

Optionally, $|d4_1|\leq 5$ μm, and $|d4_2|\leq 5$ μm.

Optionally, the transparent spacing layer has a thickness of d1, and comprises m sub-layers stacked bottom up, wherein an i-th sub-layer has a thickness of Li and a refractive index of $n_i$, wherein i is between 1 and m, parameters meet the following equations:

$$d1 = \sum_{i=1}^{m} L_i$$

$$d2 + d4_2 = \sum_{i=1}^{m} L_i \tan\theta_{1i},$$

wherein i is an integer between 1 and m, $n_i \sin \theta_{1i}$ is a constant, and $\theta_{11}=\alpha_1$.

Optionally, the sub-pixels arranged in an array further comprise a third sub-pixel adjacent to the first sub-pixel, wherein in the third sub-pixel, one light emitting unit in the light emitting layer and one transparent color filtering unit in the wavelength converting layer are comprised, and the light emitting unit and the transparent color filtering unit are stacked and spaced apart by the transparent spacing layer, the light emitting units of the first sub-pixel and the third sub-pixel are spaced apart by the first pixel defining layer in the light emitting layer, and have a top surface spacing of d5, the transparent color filtering unit does not convert a wavelength of a light emitted by the light emitting unit, and has a luminance change ratio of rc on light emitted by the light emitting unit, and the wavelength converting unit of the first sub-pixel and the transparent color filtering unit of the third sub-pixel are spaced apart by the second pixel defining layer in the wavelength converting layer, in a direction from the third sub-pixel to the first sub-pixel, relative to an orthographic projection of a boundary between a top surface of the light emitting unit of the first sub-pixel and the first pixel defining layer between the light emitting units of the first sub-pixel and the third sub-pixel on the base substrate, an orthographic projection of a boundary between a bottom surface of the first wavelength converting unit and the second pixel defining layer between the wavelength converting unit of the first sub-pixel and the transparent color filtering unit of the third sub-pixel on the base substrate is shifted by $d4_3$, wherein in all light which is incident into the transparent spacing layer from the top surface of the light emitting unit and may reach a top surface of the transparent spacing layer, light with an emergence angle of $\alpha_3$ or more has an intensity proportion of x3% or less, wherein x3%=p3×(rc/ra), wherein p3≤5%, wherein when light starting from a bottom surface of the transparent spacing layer has an emergence angle of $\alpha_3$, a projection of a light path thereof through the transparent spacing layer on the base substrate has a length less than or equal to $d5+d4_3$.

Optionally, the light emitting units emit blue light, the third sub-pixel is a blue sub-pixel, the first sub-pixel is a red sub-pixel, and the second sub-pixel is a green sub-pixel.

Optionally, ra is within [110%, 180%], rb is within [25%, 70%], and rc is within [60%, 85%].

Optionally, the wavelength converting unit comprises quantum dots.

Optionally, the transparent spacing layer comprises a first inorganic layer, an organic layer and a second inorganic layer stacked bottom up.

Optionally, the first inorganic layer is a SiNx layer, the second inorganic layer is a SiONx layer or an $A_{12}O_3$ layer, and the organic layer is an epoxy resin layer or a polyacrylic resin layer.

Optionally, the organic layer has a thickness in a range from 4 to 8 μm.

Optionally, the organic layer has a thickness in a range from 0.3 to 0.6 μm.

Optionally, a top surface of the second pixel defining layer has a width less than that of a bottom surface thereof.

Optionally, the second pixel defining layer comprises a main body and a coating layer on a side wall of the main body.

Optionally, the coating layer is an ink permeation preventing layer.

Optionally, the coating layer comprises a light reflecting material or a light absorbing material.

Optionally, a material for the coating layer is metal.

Optionally, the coating layer has a lateral extending portion away from the main body at its bottom which covers the surface of the transparent spacing layer.

Optionally, the main body has an undercut covered by the lateral extending portion of the coating layer.

Optionally, the undercut has a depth in a range from 4 to 9 μm.

Optionally, the display panel further comprises a color film layer on the wavelength converting layer.

In another aspect, the present disclosure provides a method for manufacturing the display panel described above, wherein the second pixel defining layer is fabricated by steps of:

providing a main body having an undercut;

sputtering depositing a coating layer on surfaces of the transparent spacing layer and the main body; and removing the coating layer on a top surface of the main body and the coating layer on the transparent spacing layer where it is not shielded by the top surface of the main body by dry etching, and remaining the coating layer on the side wall and in the undercut of the main body.

Optionally, the main body having an undercut is obtained by low temperature curing a black material.

Optionally, the transparent spacing layer comprises an organic layer fabricated by a molecular layer deposition process.

In yet another aspect, the present disclosure provides a display device comprising the display panel described above or a display panel manufactured by the method described above.

BRIEF DESCRIPTION OF DRAWINGS

FIGS. 14(a)-(d) show SEM photos of the structure having an undercut and a metal ink permeation preventing layer on its side wall.

FIG. 15 shows a schematic diagram of an embodiment of a QD-OLED display panel according to the present disclosure further comprising a color film layer.

FIG. 16 shows an embodiment of a related structure of the light emitting layer.

DETAILED DESCRIPTION

Figure 1A:
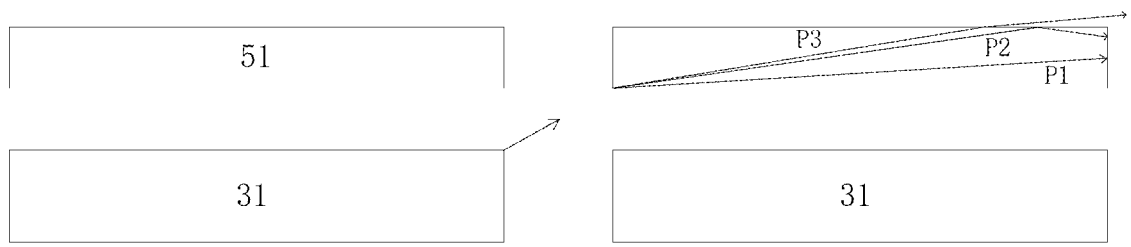
FIGS. 1(a) and 1(b) show the schematic diagrams of the light paths of light incident at large angles into a color film layer and a wavelength converting layer respectively.

The inventors have found that for the display panel comprising a wavelength converting component, in particular a QD conversion layer, the cross color issue between adjacent sub-pixels is an outstanding problem.

In related art, after the backlight from a white light emitting device of an OLED-color film type display panel is replaced with the light of an excitable wavelength converting unit such as blue light, the color film layer is replaced with a wavelength converting layer, thereby achieving the color luminescence by replacing the filtering mode with the wavelength conversion mode. On this basis, a color film layer may be additionally added to further purify the color of the wavelength-converted colored light. It should be noted that although the wavelength converting component is sometimes called a color film (for example, a QD color film) in related art, the color film layer specifically refers to a layer which selectively transmit a light with a particular wavelength in the present disclosure.

However, the wavelength conversion type display panel represented by the QD-OLED exhibits significantly more severe cross color issue between sub-pixels with different colors than the OLED-color film type display panel. Cross color refers to the phenomena that the light emitted by a light emitting unit of one sub-pixel makes another adjacent sub-pixel show color. As a result of cross color, the sub-pixel adjacent to the light emitting sub-pixel emits light when it is not ought to emit light, which is especially detrimental when the adjacent sub-pixels are sub-pixel for different colors. Severe cross color will significantly influence the display quality. When the geometric parameters of a white OLED-color film type display panel are directly used for a blue OLED-wavelength conversion type display panel, cross color, which significantly influences the display quality, will arise. The occurrence of the cross color issue has been noted in related art, but the specific cause and the solution therefor are still under research.

Without being bounded by any theory, the inventors of the present disclosure have surprisingly found that in the wavelength conversion type display panel, the wavelength conversion mechanism in the wavelength converting layer enhances the cross color phenomena. In a conventional color film layer, even if there is an incident backlight through the bottom surface from a neighboring sub-pixel, because the incidence angle is very large, the backlight travels substantially in a straight line after entering into the color film layer, where a portion of the back light is incident onto the side wall of the color film layer and cannot be output through the light-exiting surface of the color film layer, and the other portion of the backlight may be totally reflected at the light-exiting surface and thus cannot exit. Even if a small portion of the backlight may exit, the display effect when viewing in front of the display panel will not be influenced substantially due to the large emergence angle. Also, the same is substantially true even when the color film comprises scattering particles for enlarging the viewing angle, because it is difficult for the scattering particles to scatter a majority of the incident light to the front surface of the color film layer at a large deflection angle. In contrast, in the wavelength converting layer, the incident light causes photoluminescence, i.e., re-luminescence, at the light conversion site (for example, at the quantum dot microparticles). Because the angle of the output light is independent of the angle of the incident light, a large amount of light will exit from the front surface, thereby resulting in much more severe cross color phenomena than the color film type display panel with a same geometric design.

Figure 1B:
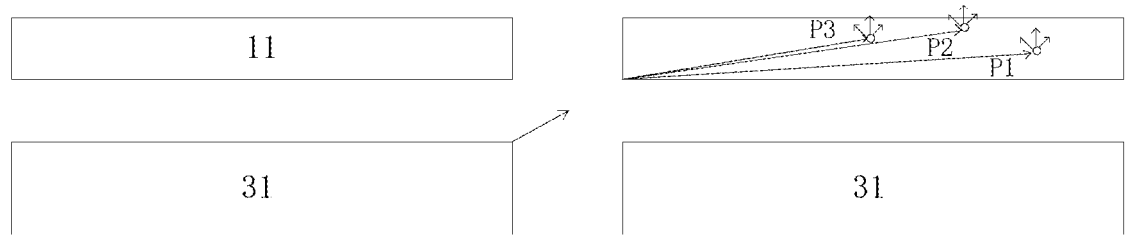

FIGS. 1(a) and 1(b) show the schematic diagrams of the light paths of lights incident at large angles into a color film layer and a wavelength converting layer respectively. FIG. 1(a) shows the condition of the color film layer. This figure schematically shows two adjacent sub-pixels. In FIG. 1(a), two adjacent sub-pixels each comprise a light emitting unit 31 as a backlight layer and a color film 51 for filtering light. When the color film layer does not comprise any scattering particles, a light emitted by the light emitting unit of the backlight layer of the sub-pixel on the left side has a large emergence angle after entering into the bottom surface of the color film layer of the neighboring sub-pixel on the right side, and then travels in a straight line. The path P1 means that the light arrives at the side wall of the color film layer, but cannot exit. The path P2 means that although the light arrives at the top surface (i.e., the light exiting surface) of the color film layer, it cannot exit because of total reflection. The path P3 means that even if the light exits, the emergence angle is very large, such that the front viewing will not be influenced. Further, even if the color film layer comprises scattering particles, they have limited overall effect on the light path, and will not cause a majority of the incident light to be output through the light-exiting surface at a small emergence angle. Therefore, in the design of the color film layer type OLED, the cross color issue may be substantially overcome by appropriately design the size such that the backlight from the neighboring sub-pixel has a large incidence angle in the color film layer. In contrast, FIG. 1(b) shows the condition of the wavelength converting layer 11 with the same size. The wavelength converting layer comprises a large amount of wavelength converting particles (such as quantum dot microparticles). The same incident light beams P1, P2 and P3 as in FIG. 1(a) will inevitably encounter the wavelength converting particles when traveling in the wavelength converting unit. At the wavelength converting particles, the incident light is subjected to wavelength conversion to become a new emitted light, the light emitting direction of which will not be limited by the incidence angle, and which may be output through the front surface of the wavelength converting unit, resulting in the cross color issue. At least partially for the above reason, the cross color issue of the wavelength conversion type display panel cannot be avoided in the design of the color film type OLED display panel.

One possible solution to this problem is to prevent light leakage by increasing the spacing between sub-pixels. Nevertheless, it is not found in related art to what extend the spacing between sub-pixels should be increased. The inventors have found that because the cross color phenomena stems from the photoluminescence caused by the incident light, blindly increasing the spacing between adjacent sub-pixels cannot completely avoid the light leakage, while may also reduce the resolution meaninglessly. Although an opaque vertical light blocking layer or the like may be additionally provided between adjacent pixels to prevent the light leakage towards the neighboring pixel, this kind of process will greatly increase the process difficulty and material cost, which is not beneficial for production.

In order to at least partially solve the above problem, the present disclosure provides a display panel comprising:

a light emitting layer on a base substrate,
a transparent spacing layer on the light emitting layer, and
a wavelength converting layer on the transparent spacing layer,
wherein the display panel comprises sub-pixels arranged in an array, the sub-pixels arranged in an array comprise a first sub-pixel and a second sub-pixel adjacent to each other, wherein in each of the first sub-pixel and the second sub-pixel, one light emitting unit in the light emitting layer and one wavelength converting unit in the wavelength converting layer are comprised, and the light emitting unit and the wavelength converting unit are stacked and spaced apart by the transparent spacing layer,
the light emitting units of the first sub-pixel and the second sub-pixel are spaced apart by a first pixel defining layer in the light emitting layer, and have a top surface spacing of d2,
the wavelength converting unit of the first sub-pixel is a first wavelength converting unit which has a luminance change ratio of ra on light emitted by the light emitting unit, and the wavelength converting unit of the second sub-pixel is a second wavelength converting unit which has a luminance change ratio of rb on light emitted by the light emitting unit, and the wavelength converting units of the first sub-pixel and the second sub-pixel are spaced apart by a second pixel defining layer in the wavelength converting layer, in a direction from the first sub-pixel to the second sub-pixel, relative to an orthographic projection of a boundary between a top surface of the light emitting unit of the second sub-pixel and the first pixel defining layer between the light emitting units of the first sub-pixel and the second sub-pixel on the base substrate, an orthographic projection of a boundary between a bottom surface of the second wavelength converting unit and the second pixel defining layer between the wavelength converting units of the first sub-pixel and the second sub-pixel on the base substrate is shifted by $d4_2$, wherein in all light which is incident into the transparent spacing layer from the top surface of the light emitting unit and may reach a top surface of the transparent spacing layer, light with an emergence angle of $\alpha_1$ or more has an intensity proportion of x1% or less, wherein x1%=p1×(ra/rb), wherein p1≤5%, wherein when light starting from a bottom surface of the transparent spacing layer has an emergence angle of $\alpha_1$, a projection of a light path thereof through the transparent spacing layer on the base substrate has a length less than or equal to $d2+d4_2$.

Figure 2:
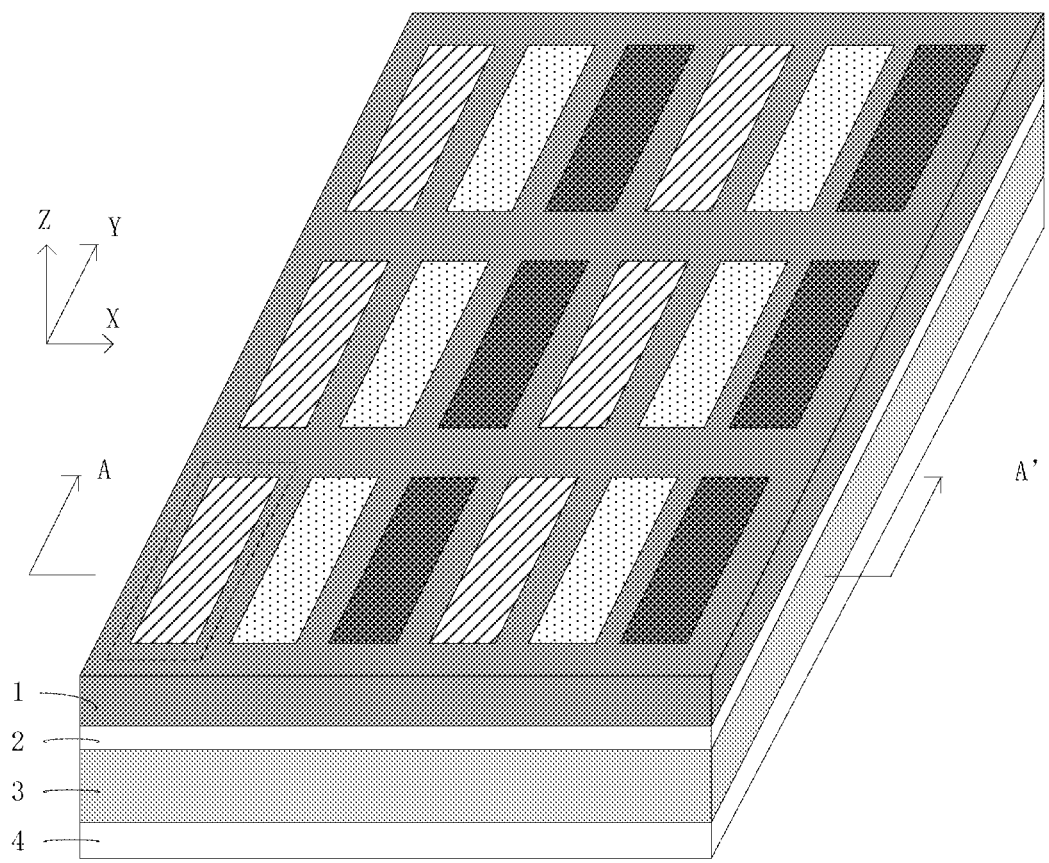
FIG. 2 shows a partial schematic diagram of related film layers of a display panel.

The display panel of the present disclosure comprises at least a structure of three layers, i.e., the light emitting layer, the transparent spacing layer and the wavelength converting layer, on the base substrate in the thickness direction. The light emitting layer is responsible for emitting light. The transparent spacing layer is used for spacing apart the light emitting layer and the wavelength converting layer, and may function to encapsulate or support both of them. The transparent spacing layer is a layer of material which is transparent at least in the visible light range. As such, the light emitted by the light emitting unit may arrive at the wavelength converting unit via the transparent spacing layer. The wavelength converting layer is used for converting the wavelength of the light emitted by the light emitting layer and traveling through the transparent spacing layer to a desired wavelength to achieve the color display. The base substrate is used for supporting the above structure of three layers. In addition, same as a conventional display panel, in order to achieve the display, the display panel of the present disclosure also comprises sub-pixels arranged in an array. FIG. 2 shows a partial schematic diagram of related film layers of a display panel.

As shown in FIG. 2, the display panel extends in the XY plane, and the Z direction is the thickness direction. The Z direction is a direction from the back surface to the front surface of the display panel. In the Z direction, there are a base substrate 4, a light emitting layer 3, a transparent spacing layer 2 and a wavelength converting layer 1 in this order. In the present disclosure, unless otherwise specifically indicated, for the convenience of describing the relative directions, the light-exiting side of the display panel is regarded as the "top side" or "front side", and the opposite side is regarded as the "bottom side" or "back side". Accordingly, the direction perpendicular to a direction from the bottom side to the top side is a "lateral direction". It should be understood that all these directions are relative directions rather than absolute directions.

When viewing from the front surface of the display panel, the display panel comprises sub-pixel arranged in an array. The sub-pixels are typically arranged in a rectangular array, but may also be arranged in any other suitable array, as long as it does not conflict with the principle of the present disclosure. FIG. 2 shows sub-pixels arranged in a 6×3 rectangular array. If the X direction is a row direction and the Y direction is a column direction, the sub-pixels in this figure are arranged in an array of 3 rows and 6 columns. They also form 6 pixels which are arranged in 3 rows and 2 columns, with each pixel comprising 3 sub-pixels in the row direction. The arrangement of the sub-pixels with different colors is not limited in the present disclosure. For example, the sub-pixels may be arranged such that 3 sub-pixels in the same pixel have different colors from each other, while the sub-pixels in the same column have the same color. Of course, the sub-pixels may be also arranged in another form. The sub-pixels have a rectangular shape, where the long edge is in the Y direction and the short edge is in the X direction. All the sub-pixels are drawn in the same size. It should be understood that the color distribution, shape, size and the like of the sub-pixels may all be selected as appropriate, as long as they do not conflict with the principle of the present disclosure. The dash line box in FIG. 2 indicates an approximate range for one sub-pixel.

The sub-pixels arranged in an array comprise a first sub-pixel and a second sub-pixel adjacent to each other. In each of the first sub-pixel and the second sub-pixel, one light emitting unit in the light emitting layer and one wavelength converting unit in the wavelength converting layer are comprised, and the light emitting unit and the wavelength converting unit are stacked and spaced apart by the transparent spacing layer. The expression "stacked" means that they are stacked one on top of another in the thickness direction of the display panel, i.e., in the Z direction. In other words, each of the first sub-pixel and the second sub-pixel comprises a light emitting unit in the light emitting layer and a wavelength converting unit in the wavelength converting layer, wherein the wavelength converting unit receives the light output upwards from the top surface on the top of the light emitting unit via its bottom surface, and output the light from the top of the wavelength converting unit after the wavelength conversion, thereby achieving the display.

Figure 3:
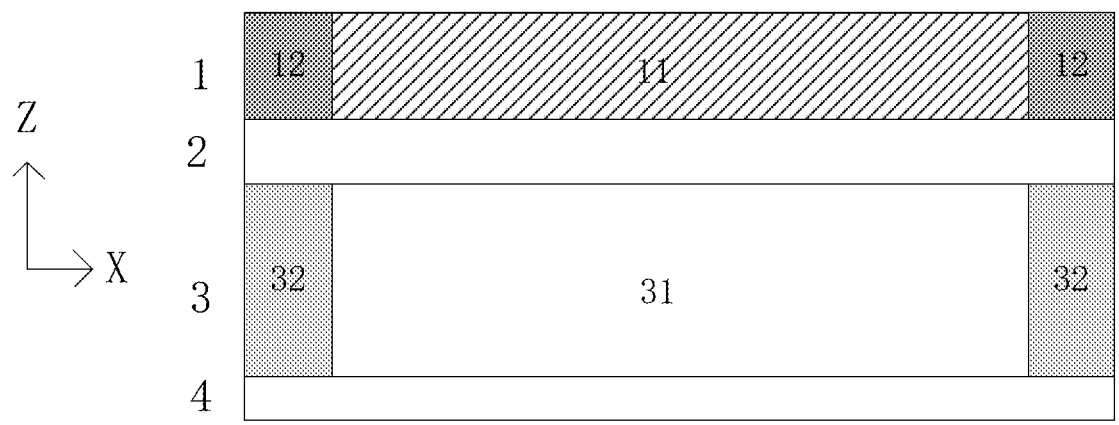
FIG. 3 shows a sectional view of a sub-pixel in the dash line box of FIG. 2 in the X-Z plane along line A-A'.

FIG. 3 shows a schematic sectional view of a sub-pixel in the dash line box of FIG. 2 in the X-Z plane along line A-A'. The sub-pixel comprises a light emitting unit 31 in the light emitting layer 3 and a wavelength converting unit 11 in the wavelength converting layer 1, which are stacked and spaced apart by the transparent spacing layer 2. The interface between the light emitting unit 31 and the transparent spacing layer 2 is the top surface of the light emitting unit 31, which outputs light toward the transparent spacing layer. The interface between the wavelength converting unit 11 and the transparent spacing layer 2 is the bottom surface of the wavelength converting unit 11, which receives the light output from the transparent spacing layer, and the light exits from the top surface of the wavelength converting unit 11 after the wavelength conversion. The wavelength converting unit 11 and the light emitting unit 31 are aligned with each other in the vertical direction, or in other words, an orthographic projection of the bottom surface of the wavelength converting unit on the base substrate is overlapped with an orthographic projection of the top surface of the light emitting unit on the base substrate, thereby the majority of the light output from the top surface of the light emitting unit 31 arrives at the bottom surface the wavelength converting unit 11 through the transparent spacing layer and enters into the wavelength converting unit 11. The wavelength converting particles in the wavelength converting unit convert the wavelength of the incident light, and output the light from its top surface.

As described above, the light emitting layer is a layer functioning to emit light, wherein the emitted light may be converted to another color through the wavelength converting layer above, or optionally may be not converted to another color, thereby achieving the color display.

The light emitting of the display panel of the present disclosure is achieved by the light emitting units in the light emitting layer. Typically, the light emitting units are arranged in an array. The light emitting units may typically emit light with an OLED, or may also emit light in another mode, such as with an QLED of an inorganic quantum dot light emitting material, Mini-LED, Micro-LED or the like. In the light emitting layer, a plurality of such light emitting units is arranged in an array in parallel to the display surface of the display panel to form a light emitting matrix. Each sub-pixel of the display panel of the present disclosure has an independent light emitting unit, and may cooperate with for example an array substrate to achieve separate on and off of each sub-pixel backlight. In an embodiment of the present disclosure, the light emitting units of the sub-pixels with different colors are the same.

The light emitting layer comprises a first pixel defining layer for defining the array of the light emitting units. It should be understood that the expression "first pixel defining layer" in the present disclosure actually defines the range of each sub-pixel, such as the ranges of red, green and blue sub-pixels, rather than an overall range of a RGB color pixel.

The patterned first pixel defining layer is provided in the light emitting layer, enclosing a plurality of spaces arranged in array for disposing the light emitting units. In FIG. 3, both sides of the light emitting unit 31 are defined by the first pixel defining layer 32.

Although the first pixel defining layer and the light emitting unit illustrated in FIG. 3 are both rectangular and have vertical side walls, they may also have tilted side walls. For example, the first pixel defining layer may have a regular trapezoidal shape, and accordingly may form an inverse trapezoidal light emitting unit. The regular trapezoidal first pixel defining layer may provide a large light-exiting surface, and a reflecting layer may also be provided on the side wall of the first pixel defining layer, thereby increasing the light output of the light emitting unit. The present disclosure focuses on the geometric features at the top of the first pixel defining layer and the top surface of the light emitting unit. Therefore, the shapes of the first pixel defining layer and the light emitting unit are not particularly limited.

The display panel of the present disclosure is a display panel comprising a wavelength converting component. The wavelength converting component is used for converting the wavelength of a light emitted by the light emitting unit to turn the light to a light with another color. It should be noted that in the present disclosure, the wavelength conversion is different from the wavelength selective transmission. The wavelength conversion means that the wavelength of the incident light is converted to another wavelength without any additional energy, while the wavelength selective transmission means that only some wavelengths of the incident light are allowed to be transmitted, but the other wavelengths are prevented from being transmitted. The wavelength conversion may be a down-conversion or an up-conversion. The down-conversion is opposite to the up-conversion, and means that a light with a shorter wavelength is converted to a light with a longer wavelength. The color display may be achieved only with the light emitting units having one color by changing the color of a light with different wavelength converting units.

The wavelength converting layer comprises a wavelength converting unit for converting a wavelength emitted by the light emitting unit of the sub-pixel to a desired color. For example, a red wavelength converting unit may convert a blue backlight to a red light, and a green wavelength converting unit may convert a blue backlight to a green light. An example of the wavelength converting unit may be a quantum dot (QD) material portion, an inorganic phosphor powder material portion, or an organic phosphor powder material portion, and may comprise a transparent matrix material and quantum dots, inorganic phosphor powders or organic phosphor powders dispersed in the matrix material. The wavelength converting unit may also be made from other wavelength converting materials. The matrix material may be a transparent organic material, such as resin, for example, cured photoresist resin, or cured ink. Any suitable down-conversion material may be used as the down-conversion material, which is not particularly limited in the present disclosure. Here, the QD down-conversion material is particularly preferred because its down-conversion performance may be controlled through the particle size.

In an embodiment, the wavelength converting unit may comprise a base resin and quantum dots mixed with the base resin (or dispersed in the base resin). The base resin may be a medium in which the quantum dots are dispersed. The base resin may be formed from at least one of various resin composite materials which are generally referred to as an adhesive. However, the inventive concept of the present disclosure is not limited thereto. For example, a medium capable of dispersing quantum dots may be used as the base resin, regardless of its name, additional functions and/or constituent materials. In some exemplary embodiments, the base resin may be a polymer resin. For example, the base resin may be an acrylic resin, an ethyl carbamate-based resin, a silicon-based resin, or an epoxy resin. The base resin may be a transparent resin.

The quantum dot may be a particle configured to convert the wavelength of an incident light. Each quantum dot may be a material having a crystal structure with a size of several nanometers, and may be composed of hundreds to thousands of atoms. The quantum dot may exhibit a quantum confinement effect, where the energy band gap is increased due to small size. When a light with a wavelength corresponding to an energy greater than the energy band gap is incident onto the quantum dot, the quantum dot may be excited by absorbing the light, and then turn to a ground state and emit a light with a particular wavelength at the same time. The emitted light may have an energy corresponding to the energy band gap. The light emitting property of the quantum dot due to the quantum confinement effect may be controlled by adjusting the size and/or composition of the quantum dot.

The quantum dot may be formed from a Group II-VI compound, a Group III-V compound, a Group IV-VI compound, a Group IV element, a Group IV compound, or any combination thereof.

The Group II-VI compound may be selected from the group consisting of: a binary compound selected from the group consisting of CdSe, CdTe, ZnS, ZnSe, ZnTe, ZnO, HgS, HgSe, HgTe, MgSe, MgS and any mixture thereof; a ternary compound selected from the group consisting of AgInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS and any mixture thereof; and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe and any mixture thereof.

The Group III-V compound may be selected from the group consisting of: a binary compound selected from the group consisting of GaN, GaP, GaAs, GaSb, AlN, AlP, AlAs, AlSb, InN, InP, InAs, InSb and any mixture thereof; a ternary compound selected from the group consisting of GaNP, GaNAs, GaNSb, GaPAs, GaPSb, AlNP, AlNAs, AlNSb, AlPAs, AlPSb, InNP, InNAs, InNSb, InPAs, InPSb and any mixture thereof; and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and any mixture thereof. The Group IV-VI compound may be selected from the group consisting of: a binary compound selected from the group consisting of SnS, SnSe, SnTe, PbS, PbSe, PbTe and any mixture thereof; a ternary compound selected from the group consisting of SnSeS, SnSeTe, SnSTe, PbSeS, PbSeTe, PbSTe, SnPbS, SnPbSe, SnPbTe and any mixture thereof; and a quaternary compound selected from the group consisting of SnPbSSe, SnPbSeTe, SnPbSTe and any mixture thereof. The Group IV element may be selected from the group consisting of Si, Ge and a mixture thereof. The Group IV compound may be a binary compound selected from the group consisting of SiC, SiGe and a mixture thereof.

In such cases, the binary compound, the ternary compound or the quaternary compound may be present in the quantum dot at a substantially uniform concentration. Alternatively, the binary compound, the ternary compound or the quaternary compound in a portion of the quantum dot may have a concentration different from that in another portion of the quantum dot.

Each quantum dot may have a core-shell structure comprising a core and a shell surrounding the core. Alternatively, the quantum dot may have a core/shell structure where one quantum dot surrounds another quantum dot. The interface between the shell and the core may have a concentration gradient, where the concentration of the element present in the shell is gradually decreased towards the center.

The quantum dot may be a nanoscale particle. Each quantum dot may have a full width at half maximum (FWHM) of the emission wavelength spectrum of about 45 nm or less, particularly about 40 nm or less, and more particularly about 30 nm or less, and the color purity and/or color reproducibility may be improved in such a range. Furthermore, the light emitted by the quantum dot may be output in all directions, and thus a wide viewing angle may be improved or achieved.

Furthermore, the shape of each quantum dot may be a common shape known in the art, but the shape of each quantum dot is not limited to any particular shape. For example, each quantum dot may have a spherical shape, a pyramid shape, a multi-arm shape, a cubic nanoparticle shape, a nanotube shape, a nanowire shape, a nanofiber shape or a nanoplate particle shape. The color of the light emitted by the quantum dot may be controlled depending on the particle size of the quantum dot, and thus the quantum dot may emit one of lights with various colors, such as red light, green light or blue light, particularly red light or green light.

In the present application, unless otherwise specifically indicated below, QD is used as an example for illustrating the wavelength converting material.

The wavelength converting units in the wavelength converting layer comprises a first wavelength converting unit which may convert an incident light to a light with a first color. For example, the first color may be red, that is, there is a red wavelength converting unit in the wavelength converting units. It should be understood that the expression "the first color", "the second color" or the like is only intended for distinguishing colors, rather than ordering the colors. In order to achieve the color display, the wavelength converting units in the wavelength converting layer may also comprise a second wavelength converting unit, or more other wavelength converting units. For example, red color may be selected as a first color, and green color may be selected as a second color. Also, for example, red color may be used as a first color, green color may be used as a second color, and blue color may be used as a third color.

Optionally, in addition to the wavelength converting units, the wavelength converting layer may also comprise a transparent color filtering unit. The transparent color filtering unit is transparent to an incident light, and no wavelength conversion occurs therein. As such, for example, the light emitted by the blue OLED in a blue sub-pixel but may be directly used for displaying blue color without wavelength conversion even when it pass through wavelength converting layer. Preferably, the transparent color filtering unit may be a light diffusing unit, for example, comprising diffusing particles, such that an incident light is scattered substantially without change in wavelength, which facilitates the display. The light diffusing unit may be prepared from a light diffusing resin having a capability of light diffusing, such that a blue light becomes more uniform after passing through it.

In an embodiment, the display panel of the present disclosure may be a down-conversion type OLED display panel. The down-conversion type OLED display panel uses a short wavelength OLED with one color, typically a blue OLED, as the light emitting unit. In the sub-pixels with different colors, a light with the above short wavelength is down-converted to a light with a relatively long wavelength by using different down-conversion materials (such as QDs), such that the color display is achieved base on the light emitting units with the same color. As an example, for the sub-pixels of all colors, a short wavelength blue OLED is used to emit light. In a red sub-pixel, the down-conversion material converts the blue light emitted by the blue OLED to red light. In a green sub-pixel, the down-conversion material converts the blue light emitted by the blue OLED to green light. Furthermore, because the blue color itself is one of the sub-pixel colors for the RGB display, in a blue sub-pixel, the blue light may be directly used for the display of the blue sub-pixel without down-conversion. Of course, a blue conversion material may also be used to adjust the color the blue pixel. Thus, the red, green and blue (RGB) color display is achieved. In the following discussion of the present disclosure, as an example for illustration, sometimes a blue backlight is used as a short wavelength backlight and down-converted to green light and red light. However, it should be understood that an emitted light with another color or a converted light with another color may also be selected.

The patterned second pixel defining layer is provided in the wavelength converting layer, enclosing a plurality of spaces arranged in array for disposing the wavelength converting units. In FIG. 3, two ends of the bottom surface of the wavelength converting unit 11 are defined by the bottom of the second pixel defining layer 12. The second pixel defining layer and the wavelength converting unit illustrated in FIG. 3 are both rectangular and have vertical side walls. Nevertheless, they may also have tilted side walls. The second pixel defining layer is also used for enclosing a space for disposing the transparent color filtering unit. Particular shape of the second pixel defining layer will be further described below.

Figure 4:
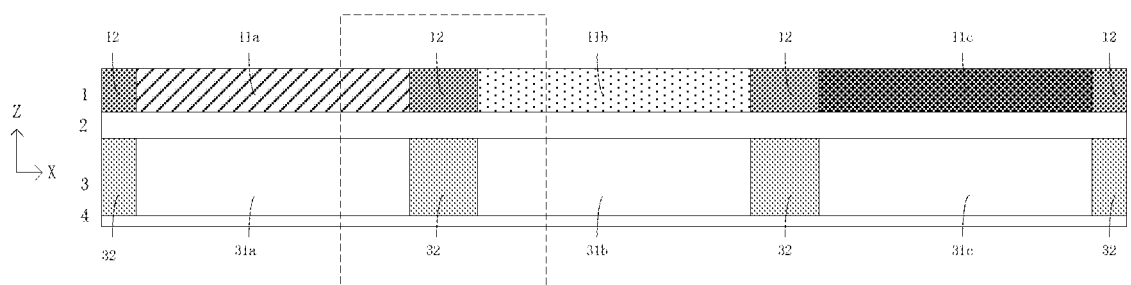
FIG. 4 shows a sectional view of a pixel comprising three parallel sub-pixels of FIG. 2 in the X-Z plane along line A-A'.

FIG. 4 shows a sectional view of a pixel comprising three parallel sub-pixels of FIG. 2 in the X-Z plane along line A-A'. The first pixel defining layer 32 defines three light emitting units 31a, 31b and 31c, and the second pixel defining layer 12 defines three units 11a, 11b and 11c. As an example, 11a and 11b represents wavelength converting units, and 11c represents a transparent color filtering unit.

This figure shows adjacent sub-pixels. As described previously, the sub-pixel of the present disclosure may be either a sub-pixel comprising a wavelength converting unit, or a sub-pixel comprising a transparent color filtering unit. Nevertheless, in the sub-pixel of the present disclosure, only if at least two adjacent sub-pixels both comprise a wavelength converting unit and have different colors, the display of at least three colors can be achieved. The third color may be either a color obtained after the light emitted by the light emitting unit is subject to wavelength conversion for another color, or a color obtained after the light emitted by the light emitting unit passes through the transparent color filtering unit. Therefore, in the present disclosure, arbitrary two adjacent sub-pixels comprising a wavelength converting unit are used as the first and second sub-pixels, and their orders may be exchanged.

In the present disclosure, the light emitting layer comprises a first pixel defining layer and a light emitting unit, the wavelength converting layer comprises a second pixel defining layer and a wavelength converting unit, and the transparent spacing layer is disposed between the light emitting layer and the wavelength converting layer. The bottom surface of the transparent spacing layer is the top surface of the light emitting unit in the light emitting layer, and the top surface of the transparent spacing layer is the bottom surface of the wavelength converting unit (or the transparent color filtering unit) in the wavelength converting layer. As shown in FIG. 4, the top surface of the first pixel defining layer 32 in the light emitting layer 3 and the top surface of the light emitting unit 31 are in the same plane, and the plane is the bottom surface of the transparent spacing layer 2. The bottom surface of the second pixel defining layer 12 in the wavelength converting layer 1 and the bottom surface of the wavelength converting unit/transparent color filtering unit 11 are in the same plane, and the plane is the top surface of the transparent spacing layer 2.

It should be noted that the relationship of the interfaces between the above layers is obtained depending on their geometric division. In other words, in view of the difference between practical structure and ideal geometric shape or standard geometric shape, the interfaces between the above layers may not necessarily be the practical interfaces between materials.

For example, the top surface and the bottom surface of the transparent spacing layer may not necessarily be practical layer interface between different materials, or may also be a dividing surface configured in the same material. Also, for example, the top of the first pixel defining layer may have a portion which is actually in the geometric range of the transparent spacing layer.

In the present disclosure, for a practical film layer structure, the reference for the bottom surface of the transparent spacing layer, i.e., the top surface of the light emitting layer is determined depending on the shape of the top surface of the first pixel defining layer, and the reference for the top surface of the transparent spacing layer, i.e., the bottom surface of the wavelength converting layer is determined depending on the shape of the bottom surface of the second pixel defining layer.

Taking the first pixel defining layer as an example, ideally, the top surface of the first pixel defining layer is planar. In this case, its top surface may be used as the reference surface for the top surface of the light emitting layer. The part right above the reference surface belongs to the transparent spacing layer. At both flanks thereof, the part below the reference surface is comprised to the light emitting unit, and the part above the reference surface is comprised to the transparent spacing layer.

Nevertheless, it may be difficult to obtain such an ideal division in a practical device. For example, the top of the first pixel defining layer may be non-planar, and the center thereof may slightly protrude. In this case, the first pixel defining layer does not have a planar top surface. However, there is still a need for a planar interface for dividing the first pixel defining layer and the transparent spacing layer.

Because the pixel defining layer functions to block light leakage between adjacent sub-pixels, when taking the cross color associated with light leakage into consideration, the point on the boundary of the first pixel defining layer, which may receive sufficient illumination from the light emitting material layer of the light emitting unit, and also may provide corresponding illumination to an adjacent wavelength converting unit, should be taken into consideration. In the present disclosure, an inflection point which has the largest slope change ratio on the profile of the first pixel defining layer is selected as the above point. After such points are selected on both sides of the first pixel defining layer, the average height of them is used as the reference for dividing the transparent spacing layer and the light emitting layer. Because the reference depends on the profile of the first pixel defining layer, it is independent of the practical boundary. In a space higher than the reference, there may be actually some material for the first pixel defining layer (for example, the above slightly protruded portion). In a space lower than the reference on both sides of the first pixel defining layer, there may also be actually some material the same as the material for the transparent spacing layer. According to the division with the reference, the practical film layer structure is fitted to a film layer having a standard flat interface, and further calculation and design are performed. Specifically, the width occupied by the first pixel defining layer on the reference line is used as the width d2 between the top surfaces of adjacent light emitting units.

Some particular embodiments for division are provided below for description.

The light emitting unit typically has an anode, a light emitting material layer and a cathode, and the cathode is typically a common cathode covering the top surfaces of the light emitting material layer and the first pixel defining layer. For example, FIG. 5(*a*) shows a typical structure. Here, 311 represents an anode, 313 represents a light emitting material layer, and 315 represents a common cathode. In this case, the top surface of the first pixel defining layer is used as a reference for dividing the light emitting layer and the transparent spacing layer. This is because the light emitting condition at the endpoints of the top surface is most representative of the principle of the present disclosure. As shown in this figure, the light emitting layer 3 and the transparent spacing layer 2 are divided by using the connecting line between the upper left corner A1 and the upper right corner A2 of the trapezoid and its extension line as a reference. Here, the common cathode on the first pixel defining layer also belongs to the range of the transparent spacing layer.

For example, FIG. 5(*b*) shows another typical condition, where the common electrode 315 is conformal to the surface below and its upper surface is uneven. Nevertheless, this will not influence the division between the transparent spacing layer and the light emitting layer. Two endpoints of the top surface of the first pixel defining layer are still used as the division reference.

As described above, FIG. 5(*a*) or 5(*b*) shows a relatively desirable standard shape, where the first pixel defining layer and the light emitting unit have a common planar top surface, and the common planar top surface is used as the interface between the light emitting layer and the transparent spacing layer. Here, the flat interfaces between various portions therein are all clear. However, in a practical device, various interfaces may be not an ideal planar surface. In this case, the most representative sites therein are selected for determining the geometric parameters.

The interfaces in the real structure of the display panel may have some deformations. Nevertheless, they may be classified to a standard shape.

For example, FIG. 5(*c*) shows a more complex structure of the periphery of the pixel defining layer than that in 5(*a*). Here, the top surface of the first pixel defining layer 32 is slightly protruded, and is no longer an ideal planar surface. In this case, as shown in this figure, a position having the largest tangent slope change ratio on the first pixel electrode layer is used as the position of the top surface of the light emitting unit and the position of the bottom surface of the transparent spacing layer. The position having the largest tangent slope change ratio is the position of an inflection point where the substantially vertical side wall of the first pixel electrode layer transitions to the substantially horizontal top surface. At this position, the light from the light emitting material layer 313 may be sufficiently obtained, and there is also enough light outputting in the lateral direction which will not be blocked by the first pixel defining layer 32. Actually, in the case of a standard trapezoidal first pixel defining layer, the position at the endpoint of the top surface is the position having the largest tangent slope change ratio.

For example, FIG. 5(*d*) shows an even more complex structure. The first pixel defining layer 32 itself forms a "mushroom shape" which is large at its upper portion and small at its lower portion. In this case, an inflection point position having the largest tangent slope change ratio above the widest site (the position indicated by the dash line) of the first pixel defining layer is used as the position of the top surface of the light emitting unit and the position of the bottom surface of the transparent spacing layer. This is because at the portion below the widest site, the light emitted at the point on the side wall of the first pixel defining layer cannot reach a neighboring sub-pixel, and thus they are not taken into consideration. It should be understood that what is considered in the present disclosure is the light exiting near the top surface of the first pixel defining layer and the light incidence near the bottom surface of the second pixel defining layer, so the geometric shapes of other portions of the first pixel defining layer or the second pixel defining layer are not the focus of the present disclosure. For example, the section of the first pixel defining layer may be a regular trapezoid with a narrow top and a wide bottom, a rectangle having a top and a bottom with substantially the same width, an inverse trapezoid with a wide top and a narrow bottom. This has little effect in determining the distance d2 between the light emitting units.

Accordingly, in FIG. 5(*d*), the layer interface between the light emitting layer 3 and the transparent spacing layer 2 is determined depending on the position of the inflection point.

Figure 5A:
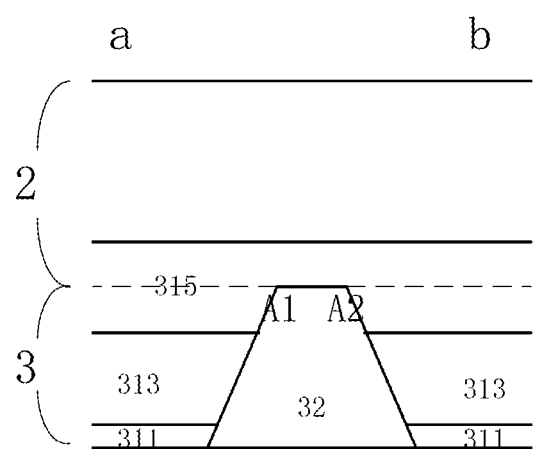
FIGS. 5(a)-(f) schematically illustrate the division of the layer structure.
Figure 5B:
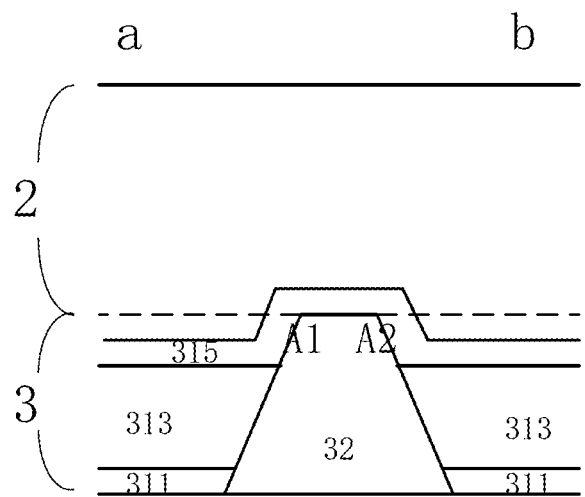
Figure 5C:
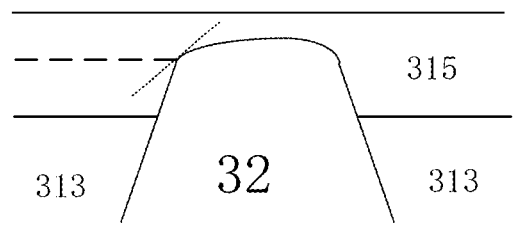
Figure 5D:
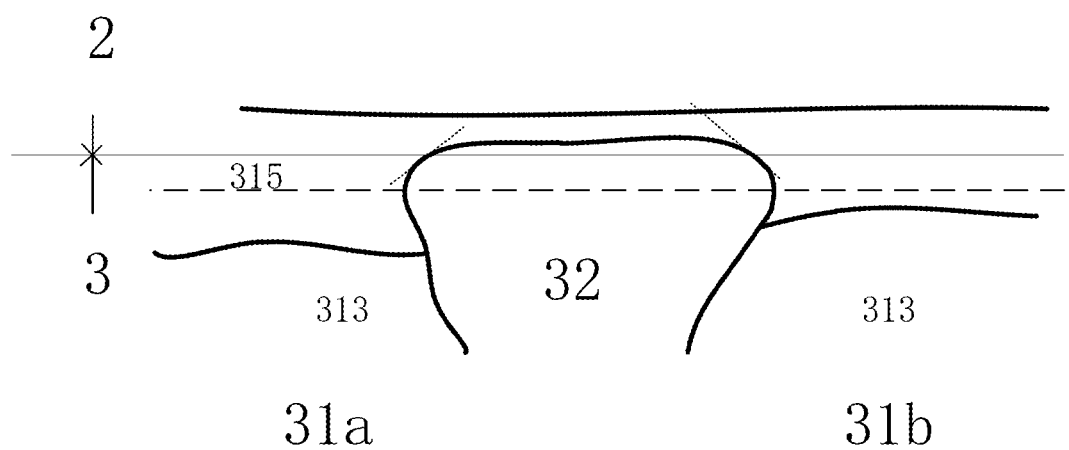

It should be understood that the tangent lines in FIGS. 5(c) and (d) are with respect to the overall profiles, ignoring the tiny uneven structures on the wall.

The above description only provides some examples for the standard region division of a real structure. A real structure may be properly divided based on the principle of the present disclosure, and all real structures satisfying the limitations of the present disclosure fall within the protection scope of the present disclosure.

As described above, when the thickness of the cathode on the top of the first pixel defining layer is different from that on the top of the light emitting material layer, a portion of the cathode above the top surface of the first pixel defining layer may be used as a portion of the transparent spacing layer, and a portion of the cathode between the first pixel defining layers and below the top surface of the first pixel defining layer may be used as a portion of the light emitting unit.

Figure 5E:
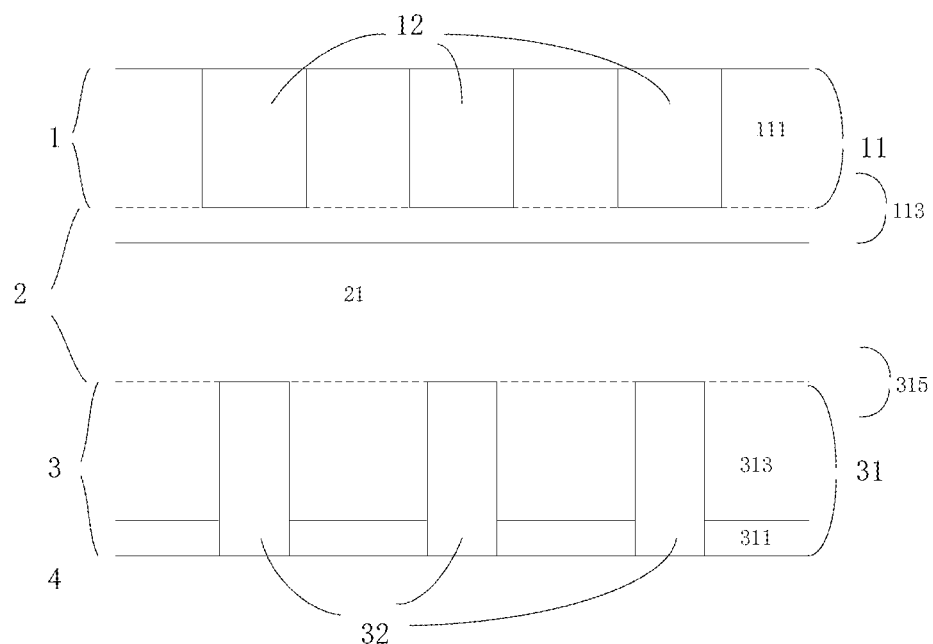

For example, FIG. 5(e) shows the layer structure division when the bottom surface of the common cathode is not planar in an embodiment. The first pixel defining layer 32 defines the height of the light emitting layer 3, and a portion of the common cathode 315 covering the light emitting layer is below the top surface of the first pixel defining layer 32. In this case, a portion of the common cathode 315 above the first pixel defining layer may be used as a portion of the transparent spacing layer 2, and a portion of the common cathode between the first pixel defining layers 32 is used as a portion of the light emitting units 31. The boundary between the transparent spacing layer 2 and the light emitting layer 3 is designated by the dash line below the transparent spacing layer.

In addition to the common cathode, any other film layer having a portion above the top of first pixel defining layer may be divided in this way.

In a direction perpendicular to the paper sheet, the boundary between the first pixel defining layer and the light emitting unit may also be not a straight line. In this case, a straight average line is used to represent the boundary.

Overall, in principle, the position of the planar top surface of the first pixel defining layer is used as a reference for determining the light emitting layer and the transparent spacing layer. When the first pixel defining layer has a slight height difference from the boundary points of the top surfaces of the light emitting units on both sides, the average height of these boundary points may be used to obtain the height of a standard planar top surface. When the top surface of the first pixel defining layer slightly protrudes relative to the top surfaces of the light emitting units on both sides, the position of the tangent slope inflection point on the top of the pixel defining layer may be used as the boundary point with respect to the top surfaces of the light emitting units.

Similarly, the standard geometric division may also be carried out on the wavelength converting layer.

For example, as shown in FIG. 5(e), particularly in the case of assembling the wavelength converting layer 1 and the light emitting unit 3 in a cell alignment process, the wavelength converting layer 1 may have a covering layer or encapsulation layer 113 which covers the wavelength conversion material 111. There may be a transparent encapsulation layer 21 between the covering layer 113 and the common cathode 315. Similarly, the bottom surface of the second pixel defining layer is used as a reference for determining the interface between the wavelength converting layer and the transparent spacing layer. A portion of the covering layer 113 is comprised into the wavelength converting unit 11, and the other portion is comprised into the transparent spacing layer 2. The boundary between the transparent spacing layer 2 and the wavelength converting layer 1 is designated by the dash line above the transparent spacing layer.

Figure 5F:
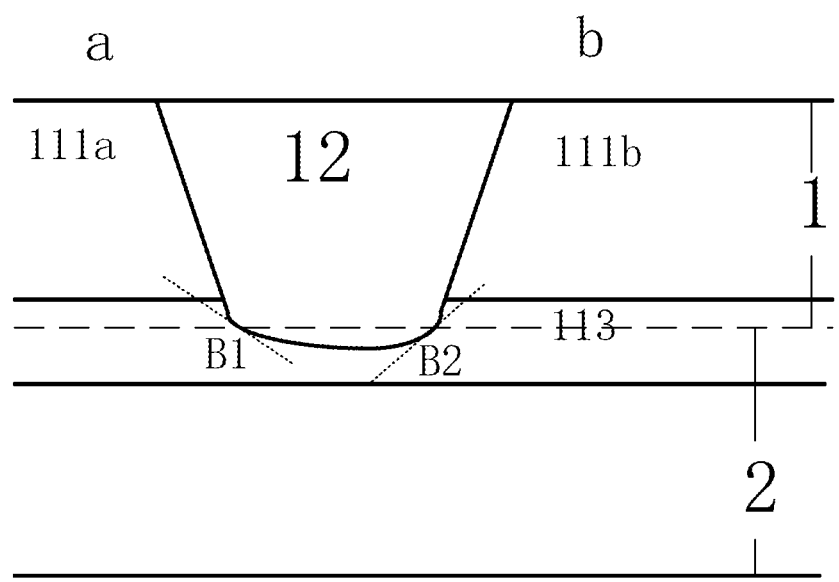

For example, FIG. 5(f) shows when the bottom surface of the second pixel defining layer is not a planar surface, an inflection point is similarly determined to determine the interface between the wavelength converting layer and the transparent spacing layer. Here, the number 12 represents a second pixel defining layer. Sub-pixels a and b are on both sides respectively, each having a wavelength converting unit 111a/111b, and the second pixel defining layer 12 and the wavelength converting units 111a and 111b are all covered by the encapsulation layer 113. Inflection points B1 and B2 are determined according to the profile shape of the bottom surface of the second pixel defining layer 12, and their average height is used as a reference for determining the boundary between the wavelength converting layer 1 and the transparent spacing layer 2. A portion of the encapsulation layer 113 belongs to the transparent spacing layer.

The present disclosure provides a special size design for the region between sub-pixels to at least partially solve the cross color issue.

Figure 6A:
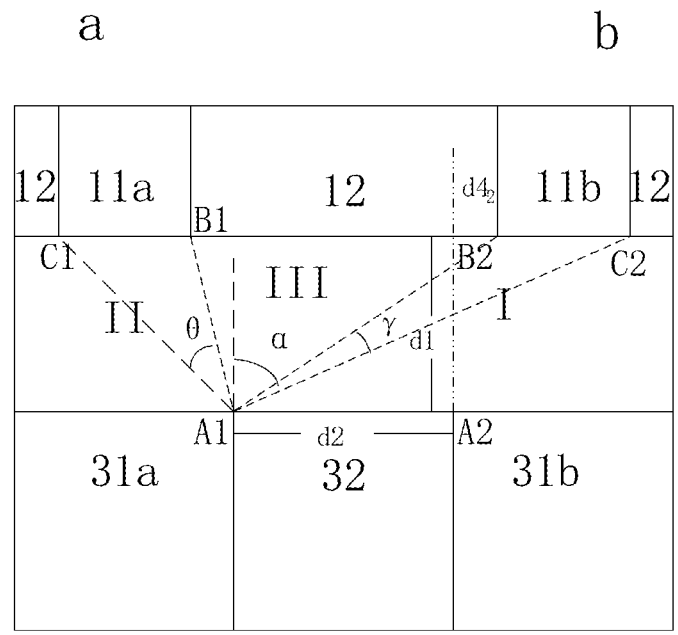
FIGS. 6(a)-(b) schematically show the principle of the present disclosure and the structure between two adjacent sub-pixels in an embodiment.
Figure 6B:
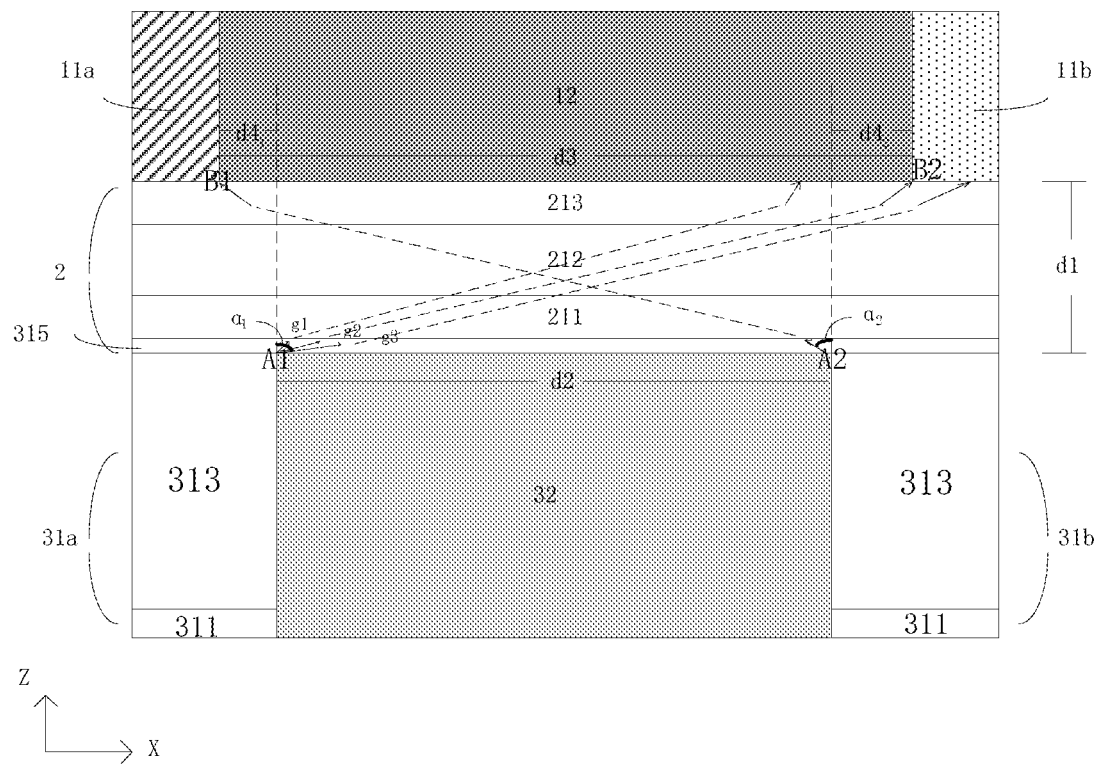

FIGS. 6(a)-(b) schematically show the principle of the present disclosure. FIG. 6(a) is a schematic diagram of the principle, showing a partial view of a sub-pixel a on the left side and a sub-pixel b on the right side defined by the first pixel defining layer 32 and the second pixel defining layer 12. The sub-pixel a on the left side comprises a light emitting unit 31a and a wavelength converting unit 11a stacked one on top of another, and the sub-pixel b on the right side comprises a light emitting unit 31b and a wavelength converting unit 11b stacked one on top of another. Ideally, the top surface of the first pixel defining layer 32 and the top surfaces of the light emitting units 31a, 31b are in the same plane, and the bottom surface of the second pixel defining layer 12 and the bottom surfaces of the wavelength converting units 11a, 11b are also in the same plane. The top surface of the light emitting unit is, for example, the top surface of the transparent pixel electrode such as the cathode of its OLED. The separating layer is of a single material. In this case, in the light output from the boundary point A1 between 31a and 32, the light emitted towards Region I (a region on the right side of the segment from A1 to B2) may arrive at 11b of the adjacent sub-pixel, the light emitted towards Region II (a region on the left side of the segment from A1 to B1) may arrive at 11a of the sub-pixel, and the light emitted towards Region III (a region on the left side of the segment from A1 to B2 and on the right side of the segment from A1 to B1) will be blocked by 12. The light arriving at 11b will cause 11b to emit light, and may lead to cross color.

The concept of the present disclosure is although there is inevitably a light emitted towards Region I and arriving at 11b, a viewer will not find the light emitted by the sub-pixel b as long as the luminance of the light emitted by the sub-pixel b is smaller enough than that of the light emitted by the sub-pixel a, thereby not resulting in substantial cross color. In other words, the object of the present disclosure is to control the relative luminance of the light emitted by the sub-pixel b, but not to simply block the light leakage between adjacent sub-pixels.

For a user, i.e., viewer of the display panel, the relative luminance of the sub-pixel is a main factor about whether the user may notice the occurrence of the color difference. The definition of luminance is a luminous intensity on a unit projection area, in nit, i.e., cd/m2. The luminous intensity is a luminous flux in a unit solid angle. The luminous flux refers to a radiation power which may be perceived by human eyes, in lumen (lm). The luminous flux for a particular wavelength is proportional to the product of the radiation power and the relative vision rate of the wavelength. The relative vision rate is also known as the spectral luminous efficiency function or the human eye vision function. A standard spectral luminous efficiency function may be, for example, obtained from the International Commission on Illumination (CIE).

The luminance viewed from the front surface of the wavelength converting unit is related to the initial powder of the power source which provides a backlight for the wavelength converting unit, the wavelength change caused by the wavelength conversion, and the capability of the wavelength converting unit itself to convert an incident light. In the present disclosure, the capability of the wavelength converting unit (or the transparent color filtering unit) to change luminance is generalized as the parameter of "luminance change ratio". In the wavelength converting unit, the luminance change ratio is used to represent the luminance change occurred during the process that the wavelength of an incident light is converted by the wavelength converting unit to obtain an emergent light. Specifically, the luminance change ratio is a ratio of the luminance of the emergent light from the wavelength converting unit after the wavelength conversion to the luminance of the incident light to the wavelength converting unit. It should be noted that there may be a portion of the incident light which has not been subjected to wavelength conversion because it does not encounter the wavelength converting particles and is directly transmitted through the wavelength converting unit. However, because a color film for filtering excessive backlight is further provided in the display device, the luminance of the incident light remained after passing through the wavelength converting unit will not substantially influence the final display luminance, and will not influence the cross color. Therefore, when taking the luminance change ratio into consideration in the present disclosure, only the luminance of the light obtained after the wavelength conversion is calculated. The luminance change ratio is affected by the combination of the light wavelength change and the wavelength converting capability. The wavelength change of a light may influence the relative vision rate portion in the luminance, while the wavelength converting capability may influence the change in its photon number. In the quantum dot wavelength converting unit, the wavelength converting capability is affected by its quantum efficiency. In the transparent color filtering unit, the luminance change ratio represents a ratio of the luminance of the emergent light from the transparent color filtering unit to the luminance of the incident light to the transparent color filtering unit. Because the wavelength is not changed therein, the luminance change is substantially affected only by the change in photon number. The luminance change ratio of a particular incident light wavelength by a particular wavelength converting unit or transparent color filtering unit may be measured through a test, or may be calculated depending on the material properties.

For example, a collimated backlight with a known luminance may be used to irradiate the bottom surface of the wavelength converting unit structure, and the luminance of the wavelength converted light at the top surface of the wavelength converting unit, to obtain the luminance change ratio. The wavelength converting unit under test may be a preformed simulation sample, such that the geometry may be designed according to the test result.

The smaller the ratio of the luminance of the light emitted by the wavelength converting unit 11b of the sub-pixel b to the luminance of the light emitted by 11a of the sub-pixel a caused by the light emitting unit 31a (or relative luminance), the weaker the cross color behavior is. In the present disclosure, a ratio of the luminance of the light emitted by the wavelength converting unit of a neighboring sub-pixel (for example, the pixel b) to the luminance of the light emitted by the wavelength converting unit of the luminescence offering sub-pixel (for example, the pixel a) is represented by a parameter p.

Through analogue simulation, the inventors have found that for different color combinations, the critical values for p are different. When p is below the critical value, it may be completely ensured that no cross color will be perceived by human eyes. In some embodiments, the critical value for p is defined to be less than 5%. More preferably, the critical value for p is defined to be less than 3.1%. Most preferably, the critical value for p is less than 2%. When it is less than 2%, for any color combination, it may be ensured that no cross color will be observed.

In the present disclosure, the geometric structure between the sub-pixels is designed to ensure that the above-mentioned value p is less than a desired critical value. In FIG. 6(a), the luminescence (the wavelength converted luminescence) of 11b due to the luminescence at A1 is caused by the light emitted into Region I, and the luminescence of 11a due to the luminescence at A1 is caused by the light emitted into Region II.

It is noted that the wavelength converted luminescence influences the luminance of the light due to changed wavelength. When different wavelengths are converted in 11a and 11b, even if they are irradiated by light of the same intensity, they exhibit different luminances.

In the present disclosure, a parameter r is used to characterize the luminance change ratio of an incident light by the wavelength converting material. That is, when the incident light has a luminance of B, the luminance of the emergent light is B×r. The luminance change ratio for the first sub-pixel a is referred to as ra, and the luminance change ratio for the second sub-pixel is referred to as rb. ra and rb are parameters related to the material properties. It should be noted that because the wavelength is changed, the luminance change ratio may be a numerical value greater than 100%.

Thus, if the total luminance of the light emitted into 11b is $B_I$, then the total luminance of the resultant emergent light is $B_I \times rb$, and if the total luminance of the light emitted into 11a is $B_{II}$, then the total luminance of the resultant emergent light is $B_{II} \times ra$. Therefore, the relative luminance of the light emitted by 11b to the light emitted by 11a is $(B_I \times rb)/(B_{II} \times ra) = B_I/B_{II} \times (rb/ra)$.

For the light emitted by 31a, its luminance is proportional to its intensity. Therefore, the relative luminance of 11b to 11a due to the luminescence at A1 equals to (the total intensity of the light emitted to 11b/the total intensity of the light emitted to 11a)×(rb/ra).

As described above, ra and rb are parameters related to the materials, and the total intensity of the light emitted to 11b and the total intensity of the light emitted to 11a are parameters related to the geometric structure.

In the plane as shown in FIG. 6(a), the total intensity of the light emitted from the A1 point to 11b is approximately the total intensity of the light beams with an emergence angle in γ. Strictly, because the light emitted from the light emitting unit passes through the transparent spacing layer before arriving at the wavelength converting layer, the intensity will be attenuated to some extent. Nevertheless, on one hand, the transparent spacing layer has a good transmittance for the light emitted by the light emitting unit, and thus the total attenuation is not large; on the other hand, the attenuation occurs at various angles, and thus the influence on the relative luminance change between adjacent pixels is not large. Therefore, the attenuation due to the material transmittance in the transparent spacing layer is neglected. The emergent light on the left boundary of the angle γ will arrive at the point B2 at the left boundary of 11b, and the emergent light on the right boundary will arrive at the point C2 at the right boundary of 11b. Although the angle γ in FIG. 6(a) appears small, the width of 11b is much greater than that as shown in the figure actually, so the angle proportion of the angle γ in Region I is not small. Furthermore, the intensity of the light emitted from A1 is not uniformly distributed in the entire emergence angle range, and when the emergence angle is very large, the intensity is relatively much smaller (which will be described in detail below). Therefore, the intensity of the light outside of the angle γ may be neglected herein. As such, it may be roughly assumed that in the light emitted from A1 to the right side, all the light with an emergence angle of a or more is incident into 11b, while all the light with an emergence angle less than a is incident into Region III and is blocked by the second pixel defining layer 12.

In the light emitted from A1 to the left side, the light in the range of θ may arrive at 11a. As described above, although the light exceeding the left side of C1 will not contribute to the luminescence of 11a, it may be neglected because the angle is very large and the total intensity is very small. Furthermore, although the emitted light corresponding to a small angle on the right side of B1 will not contribute to the luminescence of 11a, a large amount of emitted light on the left side of A1 may arrive at 11a and compensate the luminescence to some extent. Therefore, it may be roughly assumed that the total intensity incident into 11a from A1 is approximately the total intensity of all the light emitted from A1 to the range of θ and its left side, the total intensity of the light incident into 11b is the total intensity of the light with an emergence angle greater than a emitted to the range of 0-90° on the right side, and the total intensity of the light incident into 11a is the total intensity of the light of any emergence angle in the range of −90-0° on the left side.

Thus, the relative luminance of the light incident into 11b and 11a from A1 equals to (the total intensity of the light with an emergence angle greater than a/the total intensity of all the light)×(rb/ra). As described above, the relative luminance should be not greater than the critical value p1, for example 5%, preferably 3.1%, and more preferably 2%, to reduce the cross color phenomena as much as possible. When p1 is less than 2%, the cross color phenomena may be completely avoided substantially. In this case, (the total intensity of the light with an emergence angle greater than a/the total intensity of all the light)×(rb/ra)=p1. Here, when calculating the ratio, all the emitted light on the left and right sides, i.e., all the emitted light in the range from −90° to +90°, may be counted. The result is the same as that obtained by only counting the emitted light on single side of 0-90°.

In the above equation, the total intensity of the light in a certain angle range may be calculated from the relationship curve between the luminous intensity at the A1 point and the angle. The total intensity may be obtained by integrating the angle in the luminous intensity-angle curve.

Thus, after determining p, ra and rb, the critical value for α is calculated from the above equation. Further, according to the critical value, the geometric structure between 12, 32 and the transparent spacing layer may be designed. When B2 is to the right sufficiently (after exceeding the critical position), the light with an emergence angle of α in the light emitted from A1 cannot all arrive at 11b, and thus the ratio of the luminance produced after the wavelength of the light arriving at 11b is converted by 11b to the luminance produced after the wavelength of the light arriving at 11a is converted (i.e., relative luminance) will certainly less than the critical value p1, thereby solving the cross color issue.

For example, in an embodiment as shown in FIG. 6(a), the critical value p1 for p is assumed to be 5%. Then, (the total intensity of the light with an emergence angle greater than α/the total intensity of all the light)×(rb/ra)=5%. The critical B2 position is calculated according to this α value. Then, when the sub-pixel is designed such that the right end of 12 is further to the right than B2, the cross color issue may be solved.

More specifically, for example, when the transparent spacing layer is a single layer of material with a uniform refractive index, and rb/ra=2, the proportion of the intensity of the light with an emergence angle greater than α is 2.5%. In this case, the corresponding a angle is 80°, for example. Because the transparent spacing layer is a single layer of material and light is transmitted straightly therein, if the transparent spacing layer has a thickness d1 of 2 μm, then the critical lateral distance from B2 to A1 equals to 2 μm×tan 80°=11.34 μm. The above lateral distance is the sum of the width d2 of the top surface of 32 and the portion $d4_2$ of the bottom surface of 12 exceeding the boundary of 32. The cross color issue may be solved by simply designing d2+$d4_2$ to be greater than the critical value. For example, when the width d2 of 32 is 10 μm, the portion $d4_2$ of B2 exceeding A2 should be large than 1.34 μm.

It should be understood that although the figure only shows the light in the paper plane, because the light starting from A1 towards the outside of the paper sheet is bilaterally symmetric, and the light emitting unit and the wavelength converting unit both extend in a direction perpendicular to the paper sheet, i.e., is symmetric in the direction perpendicular to the paper sheet, the effect of the light outside of the paper sheet on the critical estimation for the above relative luminance may be counteracted or neglected.

FIG. 6(a) only shows the analysis of the cross color from the sub-pixel a on the left side to the sub-pixel b on the right side. The cross color from the sub-pixel on the right side to the sub-pixel on the left side may also be analyzed symmetrically. For the cross color from the sub-pixel on the right side to the sub-pixel on the left side, the critical value p2 may be set according to the color selection. p2≤5%, and more preferably ≤2%. p2 may equal to p1, as long as it may be ensured that there is no apparent cross color. It should be noted that all the relationships between the parameters of the present disclosure may be extended to other sub-pixel conditions as appropriate, as long as the principle of the present disclosure is satisfied.

Specifically, in a direction from the second sub-pixel to the first sub-pixel, relative to an orthographic projection of a boundary between a top surface of the light emitting unit of the first sub-pixel and the first pixel defining layer between the light emitting units of the first sub-pixel and the second sub-pixel on the base substrate, an orthographic projection of a boundary between a bottom surface of the first wavelength converting unit and the second pixel defining layer between the wavelength converting units of the first sub-pixel and the second sub-pixel on the base substrate is shifted by $d4_1$, wherein
in all light which is incident into the transparent spacing layer from the top surface of the light emitting unit and may reach a top surface of the transparent spacing layer, light with an emergence angle of $\alpha_2$ or more has an intensity proportion of x2% or less, wherein x2%=p2×(rb/ra), wherein p2≤5%,
wherein when light starting from a bottom surface of the transparent spacing layer has an emergence angle of $\alpha_2$, a projection of a light path thereof through the transparent spacing layer on the base substrate has a length less than or equal to $d2+d4_1$.

Cross color may be effectively avoided as long as the lateral distance from A1 to B2 or from A2 to B1 satisfies the above relationship. In other words, as long as the lateral distance of $d2+d4_1$ or $d2+d4_2$ satisfies the condition of being greater than the critical value of the light path projection length corresponding to respective critical angle $\alpha$, cross color may be avoided. Optionally, the above lateral distance is not necessarily set too large, and only needs to be slightly greater than the critical value. In other words, the difference between the lateral distance and the critical value may be as small as possible. The difference between the lateral distance and the critical value may be less than or equal to 10 µm. Optionally, when the light starting from the bottom surface of the transparent spacing layer has an emergence angle of $\alpha_1$, the difference between the length of the projection of the light path through the transparent spacing layer on the base substrate and $d2+d4_2$ is less than or equal to 5 µm, less than or equal to 4 µm, less than or equal to 3 µm, less than or equal to 2 µm, less than or equal to 1 µm, or less than or equal to 0.5 µm, or $d2+d4_2$ is designed to exactly correspond to the critical emergence angle $\alpha_1$. Optionally, when the emergence angle is $\alpha_2$, the difference between the length of the projection of the light path through the transparent spacing layer on the base substrate and $d2+d4_1$ is less than or equal to 5 µm, less than or equal to 4 µm, less than or equal to 3 µm, less than or equal to 2 µm, less than or equal to 1 µm, or less than or equal to 0.5 µm, or $d2+d4_1$ is designed to exactly correspond to the critical emergence angle $\alpha_2$.

As compared to related technology, in the geometric design of the present disclosure, no light shielding part is added between adjacent sub-pixels, and the lower limit of the spacing between adjacent sub-pixels is given, such that the resolution may be increased as much as possible while no cross color occurs.

FIG. 6(b) schematically shows a structure between two adjacent sub-pixels a and b in an embodiment where the structure is finer than that as shown in the principle diagram of FIG. 6(a), wherein the transparent spacing layer has a plurality of sub-layers stacked one on top of another. The first sub-pixel a comprises a light emitting unit 31a and a wavelength converting unit 11a, and the second sub-pixel b comprises a light emitting unit 31b and a wavelength converting unit 11b. The boundary between the top surface of the light emitting unit of the first sub-pixel and the first pixel defining layer is A1, and the boundary between the bottom surface of the wavelength converting unit and the second pixel defining layer is B1. The boundary between the top surface of the light emitting unit of the second sub-pixel and the first pixel defining layer is A2, and the boundary between the bottom surface of the wavelength converting unit and the second pixel defining layer is B2. The light emitting units 31a and 31b each comprise an anode 311 and a light emitting material layer 313. They are spaced apart by the first pixel defining layer 32, and the distance between the top surfaces of the light emitting units 31a and 31b is the width d2 therebetween on the top surface of the first pixel defining layer, i.e., the width between the A1 point and the A2 point. The light emitting unit comprises an anode and a light emitting material layer. A transparent spacing layer 2 is disposed above the light emitting units 31a, 31b and the first pixel defining layer. The exemplary transparent spacing layer as shown in FIG. 6(b) has 4 film layers, comprising a common cathode 315, a first inorganic layer 211, an organic layer 212 and a second inorganic layer 213. A second pixel defining layer is disposed between the wavelength converting units 11a and 11b. The distance between the bottom surfaces of the wavelength converting units 11a and 11b is the width d3 therebetween at the bottom surface of the second pixel defining layer, i.e., the width between the B1 point and the B2 point. In a direction from the second sub-pixel to the first sub-pixel (i.e., the leftward direction), relative to an orthographic projection of a boundary A1 between a top surface of the light emitting unit of the first sub-pixel and the first pixel defining layer between the light emitting units of the first sub-pixel and the second sub-pixel on the base substrate, an orthographic projection of a boundary B2 between a bottom surface of the first wavelength converting unit and the second pixel defining layer between the wavelength converting units of the first sub-pixel and the second sub-pixel on the base substrate is shifted by $d4_1$. Here, $d4_1$ may be a negative value, which means that B1 may also be to the left of A1. In a direction from the first sub-pixel to the second sub-pixel (i.e., the rightward direction), relative to an orthographic projection of a boundary A2 between a top surface of the light emitting unit of the second sub-pixel and the first pixel defining layer between the light emitting units of the first sub-pixel and the second sub-pixel on the base substrate, an orthographic projection of a boundary B2 between a bottom surface of the second wavelength converting unit and the second pixel defining layer between the wavelength converting units of the first sub-pixel and the second sub-pixel on the base substrate is shifted by $d4_2$. $d4_1$ and $d4_2$ are actually the lateral distances by which the bottom edges of the second pixel defining layer protrudes or retracts relative to the edges of the first pixel defining layer below. $d3=d2+d4_1+d4_{2_{602}}$ In the present disclosure, the sizes of the first pixel defining layer and the second pixel defining layer between adjacent sub-pixels are determined according to the proportions of different luminescence angles of the light emitting unit and the luminance change ratio for the wavelength converting unit on the light emitting unit, thereby controlling the cross talk between adjacent sub-pixels.

In FIG. 6(b), in the light emitted by the light emitting unit 11a of the sub-pixel a, what may cause the cross talk issue to the sub-pixel b is the light which may travel from the light emitting surface of the light emitting unit 11a through the transparent spacing layer to the wavelength converting unit 11b. In the present disclosure, the amount of such light is controlled through structure design to an extent that the display of the sub-pixel b will not be significantly influenced.

The point in the bottom surface of the wavelength converting layer 11b nearest to the A1 point in the top surface of the light emitting unit 31a is its left endpoint B2, i.e., the right end of the bottom surface of the second pixel defining layer, or the boundary between the bottom surface of the wavelength converting unit and the second pixel defining layer. For the incident light from the A1 point, the light with a smaller emergence angle will travel closer in the X direction, not enough to arrive at the B2 point; and only the light with a larger emergence angle may arrive at the B2 point. In the present disclosure, the incidence angle and the emergence angle both refer to the angle with respect to the normal line and are within the range of 0-90°, and incidence and emergence are relative to the interface. In other words, there is a critical emergence angle $\alpha_1$, such that when the emergence angle is the critical angle or less, the emitted light g1 will not arrive at the wavelength converting unit 11b to cause cross talk, and only the light g2, g3 with an emergence angle equal to or larger than the critical angle may arrive at the wavelength converting unit 11b. The dash line in the figure represents the light corresponding relationship, but does not represent that the light travels in a straight line in practice. It differs from FIG. 6(a) in that the light does not travel in a straight line between A1 and B2, but is refracted multiple times. These refractions are indicated by dash line in the figure, and no particular refraction light path is shown. Nevertheless, although refractions occur in the transparent spacing layer, the principle of the present disclosure is still applicable.

As described above, in contrast to the color film layer, even if the light incident into the wavelength converting layer has a large emergence angle, the cross color issue may also be caused. The above critical angle is determined according to the intensity distribution of the light-exiting angle of the light emitting unit. The luminance of the cross color may be controlled to be small enough by make the above critical angle satisfy the condition that "the proportion of the incident light with an angle greater than the critical angle is lower than the threshold", thereby practically solving the cross color issue.

In the present disclosure, the above threshold is determined through the relationship between the luminance change ratios of the wavelength converting units of the first sub-pixel and the second sub-pixel. The display effect of the sub-pixel of the display device is related to its luminous intensity and the human eye's perception on its luminous wavelength, which collectively exhibit as its luminance. With reference to FIG. 6(b), when x1% of the light emitted from A1 to the right to the top surface of the transparent spacing layer may arrive at the neighboring second sub-pixel on the right side, the ratio of the luminance which may be produced due to cross color in the second sub-pixel to the luminance of the light emitted by the light emitting unit is x1%×rb, and the ratio of the luminance of the first sub-pixel itself caused by the light emitted from the A1 point to the left to the luminance of the light emitted by the light emitting unit is ra, wherein ra and rb are luminance conversion rates of the first sub-pixel and the second sub-pixel on the light of the light emitting units respectively. The cross color luminescence in the second sub-pixel is compared to the normal luminescence in the first sub-pixel, and the luminance ratio is x1%×rb/ra, which may be expressed as x1%×(rb/ra). Through simulation of the practice, when the luminance ratio is less than 5%, substantially no cross color phenomena which may be perceived by human eyes occurs. Therefore, when p is the critical value p1, x1%×(rb/ra)=p1, i.e., x1%=p1×(ra/rb). The critical value p1 may be more preferably 3.1% or less, and even more preferably 2% or less.

It should be noted that because in contrast to the transparent spacing layer of single material in FIG. 6(a), the transparent spacing layer in FIG. 6(b) has stacked film layers with different refractive indexes, total reflection will occur, such that a portion of light cannot arrive at the wavelength converting unit. In this case, when calculating the intensity of the light arriving at the wavelength converting units of both sub-pixels, the light which cannot arrive at the top surface of the transparent spacing layer is not included, because the light will not cause cross color. The solution of the present disclosure only considers the luminous intensity proportion in the light which is incident into the transparent spacing layer from the top surface of the light emitting unit and may reach a top surface of the transparent spacing layer. When there is a possibility of total reflection in the transparent spacing layer, the total reflected portion needs to be removed. For example, when the transparent spacing layer comprises a sub-layer with a refractive index of 1.8 and a sub-layer with a refractive index of 1.5 closely adjacent thereto in the light-exiting direction, the light with an incidence angle from the sub-layer with a refractive index of 1.8 to the sub-layer with a refractive index of 1.5 greater than about 520 will be total reflected. In this case, corresponding critical angle or the like may be calculated from the total luminous intensity of the initial incident light corresponding to the range from 0 to 52° in this layer. Because the light with an incidence angle greater than 52° does not arrive at the top surface of the transparent spacing layer, it will not influence the wavelength converting layer, and thus the intensity of the light is not taken into consideration in calculating the critical geometric parameters.

Therefore, if the intensity proportion of the light from the A1 point to the B2 point is limited to be the above critical value x1% or less, then the cross color issue may be effectively eliminated. In this case, when the incident light with an emergence angle of $\alpha_1$ from the interface between the transparent spacing layer and the light emitting unit is output at the top surface, the lateral distance from the incidence point to the emergence point needs to be less than or equal to d2+d4$_2$, i.e., the sum of the distance from A1 to A2 and the lateral distance from A2 to B2. It can be understood that if the edge of the second pixel defining layer retracts relative to the edge of the first pixel defining layer, d4$_2$ may also be a negative value. Here, in the light emitted by the light emitting unit and incident to the interface, the intensity proportion of the light with an emergence angle greater than $\alpha_1$ is x1% or less.

In summary, the design idea of the present disclosure is as follows. First, the luminance change coefficients of wavelength converting units (or a transparent color filtering unit) of two adjacent sub-pixels on a light emitting unit are determined. Second, it is considered that in the light emitted by the light emitting unit of one sub-pixel, what proportions of the light arriving at the neighboring sub-pixel and the light arriving at this sub-pixel will cause the neighboring sub-pixel to produce a luminance sufficient to display cross color. In this process, the above luminance change coefficients are taken into consideration, and the luminance proportion sufficient to display cross color is set as the critical ratio p obtained by simulation. Finally, the upper limit x % for the proportion of the light arriving at the neighboring sub-pixel which should not be exceeded is calculated. Third, considering the critical emergence angle $\alpha$ of at the bottom surface of the transparent spacing layer corresponding to these proportions of light, the proportion of the light with an emergence angle greater than a is defined as the above upper limit x %. That is, the lower limit for the emergence angle is calculated, and it is necessary to avoid that the light with an emergence angle less than the lower limit may arrive at the neighboring sub-pixel. Fourth, from the critical emergence angle, the lower limit for the lateral distance between the start point and the end point of the light path, d2+d4, is calculated. As such, as long as the distance of d2+d4 is large enough (greater than the lateral distance between the start point and the end point of the light path corresponding to the critical angle α), it may be ensured that the light with an emergence angle less than α will not enter into the neighboring sub-pixel, such that it may be ensured that only less than x % of the light enters into the neighboring sub-pixel. In turn, it may be ensured that after the luminance conversion by the wavelength converting unit, the ratio of the luminance produced in the neighboring sub-pixel to the luminance produced in the light emitting sub-pixel is less than the critical ratio, such that cross color which will influence the practical viewing does not occur.

For practically prepared first pixel defining layer, second pixel defining layer, light emitting unit, wavelength converting unit and transparent spacing layer which have a non-standard shape, after fitting them to a standard shape according to the above principle, it may be determined whether their geometric features meet the requirements of the present disclosure, i.e., whether to achieve the object of the present disclosure that a limited ratio of light arrives at the neighboring sub-pixel, and whether the limitation on the relative luminance is met after conversion calculation. It should be understood that although the following drawings are all drawn based on standard shapes, the technical solutions in accordance to the above principle are also included.

Figure 7:
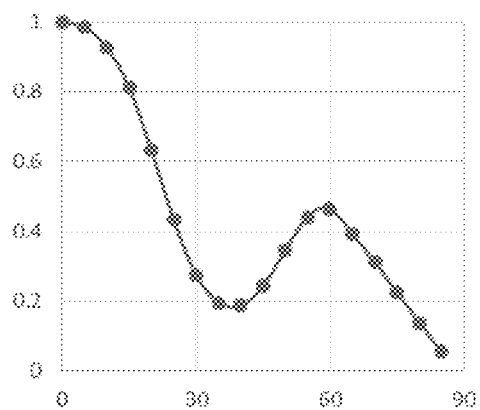
FIG. 7 schematically shows an emergence angle-light intensity curve.

In the light emitted by the light emitting unit and incident to the interface, the value of the critical emergence angle α corresponding to the intensity proportion of the light greater than a particular value may be measured through a test or calculated by modeling. The inventors have found that the intensity of the light incident into the transparent spacing layer at the interface between the light emitting unit and the transparent spacing layer may vary with the angle. For example, the light with an emergence angle of 0° (i.e., in the normal line direction) has the highest intensity, while the light with an emergence angle close to 90° has an intensity close to zero. Also, the relationship between the intensity and the angle may be not monotonously increased or decreased. FIG. 7 schematically shows an emergence angle-light intensity curve. The intensity decreases to a minimum value around 40 degree, then rises up, reaches the maximum value around 60 degree, and then decreases again. The above threshold may be calculated by calculating the area proportion below the emergence angle-light intensity curve. Thus, the magnitude of the critical angle may be determined from the threshold. The emergence angle-light intensity curve may be measured through a test or calculated by modeling. In the light field distribution as shown in FIG. 7, the intensity proportions of the light with some angles of 60° or more are shown in the table below.

| Angle (°) | 60 | 65 | 70 | 75 | 80 | 85 |
|---|---|---|---|---|---|---|
| Intensity proportion (%) | 21.8 | 15.6 | 11.0 | 6.45 | 2.4 | 0.6 |

FIG. 7 and the above table only show an exemplary light field distribution. Particular light field distribution may be different from that as shown in FIG. 7.

The cross color effect of the first sub-pixel on the second sub-pixel is accurately controlled through the above structure design.

Also, the sizes of the encapsulation structure layer, the first pixel defining layer, and the second pixel defining layer in FIG. 6(b) also need to ensure that the cross color effect of the second sub-pixel on the first sub-pixel is under control. In this regard, when the light with an emergence angle of $\alpha_2$ is output at the top surface, the lateral distance between the emergence point and the incidence point is not greater than $d2+d4_1$, wherein in the light emitted by the light emitting unit and incident to the interface, the intensity proportion of the light with an emergence angle greater than $\alpha_2$ is x2% or less, wherein x2%=p2×(rb/ra). Here, the critical value p2 which has a value of 5% is selected.

It is noted that the aforementioned condition only defines the sum of d2 and $d4_2$ or the sum of d2 and $d4_1$, but has no requirement on the proportion of d2 in $d2+d4_2$. Generally, the size of the first pixel defining layer is firstly designed, and then the sized of the second pixel defining layer is further designed. In other words, d2 is firstly determined, and then $d4_1$ and $d4_2$ are determined based on d2. In the embodiment as shown in FIG. 6(b), the bottom of the second pixel defining layer is wider than the top of the first pixel defining layer, and thus $d4_1$ and $d4_2$ are positive values. Nevertheless, in some embodiments, $d4_1$ and $d4_2$ may also be a negative value, which corresponds to the case that the bottom of the second pixel defining layer is narrower than the top of the first pixel defining layer. In some other embodiments, $d4_1$ and $d4_2$ may be substantially 0.

In some embodiments, for the convenience of preparation, the second pixel defining layer and the first pixel defining layer are arranged such that their centers are aligned with each other, and thus $d4_1$ equals to $d4_2$. It can be understood that when ra does not equal to rb, the critical values for the values of $d4_1$ and $d4_2$ should be such that the intensity proportion of the light with an emergence angle of $\alpha_1$ or less is x1% or less, and the intensity proportion of the light with an emergence angle $\alpha_2$ or more is x2% or less. In this case, the larger one of the critical values for $d4_1$ and $d4_2$ may be used for the sub-pixels on both sides, thereby achieving a symmetric design. For example, when ra>rb, the luminance change ratio for the wavelength converting material of the first sub-pixel is higher. In this case, it is supposed that x1>x2, that is, the upper limit for the proportion of the light with an emergence angle of $\alpha_1$ or more may be greater than the upper limit for the proportion of the light with an emergence angle of $\alpha_2$ or more, i.e., $\alpha_1<\alpha_2$. Accordingly, the critical value for $d4_1$ is greater than the critical value for $d4_2$. In this case, $d4_2$ may also be configured according to the critical value for $d4_1$, such that the lateral traveling distance of the light path meets the requirement for preventing the cross color from the second sub-pixel to the first sub-pixel, while the lateral traveling distance of the light path certainly also meets the requirement for preventing the cross color from the first sub-pixel to the second sub-pixel cross color.

Of course, in the present disclosure, different sub-pixel geometric sizes may be designed according to particular parameters of two adjacent sub-pixels. If it is not taken into consideration that the second pixel defining layer and the first pixel defining layer appear to be axially symmetric in the section, then $d4_1$ may be not equal to $d4_2$.

In an embodiment, the second pixel defining layer and the first pixel defining layer are arranged such that their centers are aligned with each other, and the bottom of the second pixel defining layer has a width the same of that of the top of the first pixel defining layer, i.e., $d4_1=d4_2=0$. In this way, the film layers are prepared conveniently with an apparatus such as the same mask.

In an embodiment, given that there may be an alignment accuracy variation of 1-5 μm in practical production, optionally, the size range may be broaden to $|d4_1|\leq 5$ μm, ≤4 μm, ≤3 μm, ≤2 μm, or ≤1 μm. Likewise, optionally, $|d4_2|\leq 5$ μm, ≤4 μm m, ≤3 μm, ≤2 μm, or ≤1 μm.

Figure 8:
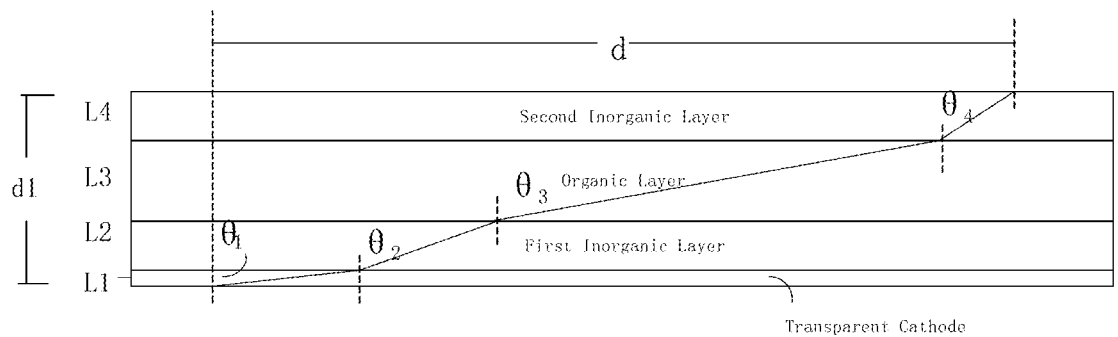
FIG. 8 shows an exemplary light path in the transparent spacing layer as shown in FIGS. 6(a)-(b).

After determining the critical angle, the relationship between various sizes may be determined from the light path calculation in the transparent spacing layer. In other words, when the display panel is manufactured according to the relationship between the sizes obtained, the display panel will not exhibit obvious cross color issue. In this case, the structure design is simplified to independent light path calculation in the transparent spacing layer. FIG. 8 shows an exemplary light path in an exemplary transparent spacing layer. Four layers are L1 to L4 from bottom to top respectively. For example, L1 may be an ITO cathode layer, and a first inorganic layer, an organic layer, and a second inorganic layer, and the like are overlaid thereon in this order. Their refractive indexes are n1 to n4 respectively. During the traveling of a light incident from the bottom side of the transparent cathode layer and with an emergence angle of θ1 towards the top surface of the transparent spacing layer, every time the light passes through an interface, the angle is changed according to the refractive index equation. n1 sin $\theta_1$=n2 sin $\theta_2$=n3 sin $\theta_3$=n4 sin $\theta_4$. From the angles, the relationship between the lateral optical distance and the vertical optical distance may be further calculated. Lateral optical distance d=L1 tan $\theta_1$+L2 tan $\theta_2$+L3 tan $\theta_3$+L4 tan $\theta_4$. Thus, the geometric relationship between the first sub-pixel and the second sub-pixel may be calculated by defining $\theta_1$ to be $\alpha_1$ determined by x1 or $\alpha_2$ determined by x2, thereby completing the structure design.

Thus, when a particular transparent spacing layer is used, the desired lateral distance between sub-pixels may be obtained according to the relationship in the present disclosure. Oppositely, when a certain resolution is desired, the transparent spacing layer and particular sub-layer configuration thereof may be selected according to the relationship in the present disclosure.

In an embodiment, the transparent spacing layer has a thickness of d1, and comprises m sub-layers stacked bottom up, wherein an i-th sub-layer has a thickness of Li and a refractive index of ni, wherein i is between 1 and m,
parameters meet the following equations:

$$d1 = \sum_{i=1}^{m} L_i$$

$$d2 + d4_2 \geq \sum_{i=1}^{m} L_i \tan\theta_{1i},$$

wherein i is an integer between 1 and m, ni sin θ1i is a constant, and $\theta_{11}=\alpha_1$.

In other words, the lateral traveling distance of the light path is the sum of the traveling distance in each of the sub-layers. The traveling distance in each of the sub-layers is related to the emergence angle at each light-incoming interface and the thickness of the sub-layer. The emergence angle at each light-incoming interface is related to the refractive indexes of this sub-layer and the sub-layer preceding this sub-layer. When the emergence angle α of the light entering into the bottom interface of the first sub-layer is determined, d1, d2 and d4 may be calculated according to the above process. For example, for the emergence angle of $\alpha_1$, d2+d4$_2$ may be calculated as described above; for the emergence angle of $\alpha_2$, d2+d4$_1$ may be calculated similarly; and for the emergence angle of $\Delta_3$ below, d5+d4$_3$ may be calculated similarly; and so on.

It should be also noted that when the bottom of the transparent spacing layer comprises a metal transparent cathode, although the very thin metal transparent cathode is transmissive to the light, it may be not suitable to characterize the reflection behavior of the light therein with the conventional refractive index. Nevertheless, the metal transparent cathode has a thickness much less than that of the inorganic/organic encapsulation layer thereon. Typically, the metal transparent cathode has a thickness of up to tens of nanometers, and the encapsulation layer thereon has a size on the order of micrometer. Therefore, in the calculation according to the above equations in the present disclosure, the presence of the metal transparent cathode may be neglected. That is, the thickness of the metal transparent cathode and the lateral traveling of the light therein are not counted. In this case, the emergence angle θ11, θ12 of the light is calculated for the top surface of the metal transparent cathode as the interface. Nevertheless, for example, with respect to a cathode, such as an ITO electrode, with a large thickness, the traveling of the light therein should not be neglected.

In an embodiment, the sub-pixels arranged in an array further comprise a third sub-pixel adjacent to the first sub-pixel, wherein in the third sub-pixel, one light emitting unit in the light emitting layer and one transparent color filtering unit in the wavelength converting layer are comprised, and the light emitting unit and the transparent color filtering unit are stacked and spaced apart by the transparent spacing layer,
the light emitting units of the first sub-pixel and the third sub-pixel are spaced apart by the first pixel defining layer in the light emitting layer, and have a top surface spacing of d5,
the transparent color filtering unit does not convert a wavelength of a light emitted by the light emitting unit, and has a luminance change ratio of rc on light emitted by the light emitting unit, and the wavelength converting unit of the first sub-pixel and the transparent color filtering unit of the third sub-pixel are spaced apart by the second pixel defining layer in the wavelength converting layer,
in a direction from the third sub-pixel to the first sub-pixel, relative to an orthographic projection of a boundary between a top surface of the light emitting unit of the first sub-pixel and the first pixel defining layer between the light emitting units of the first sub-pixel and the third sub-pixel on the base substrate, an orthographic projection of a boundary between a bottom surface of the first wavelength converting unit and the second pixel defining layer between the wavelength converting unit of the first sub-pixel and the transparent color filtering unit of the third sub-pixel on the base substrate is shifted by d4$_3$,
wherein
in all light which is incident into the transparent spacing layer from the top surface of the light emitting unit and may reach a top surface of the transparent spacing layer, light with an emergence angle of $\alpha_3$ or more has an intensity proportion of x3% or less, wherein x3%=p3×(rc/ra), wherein p3≤5%,
wherein when light starting from a bottom surface of the transparent spacing layer has an emergence angle of $\alpha_3$, a projection of a light path thereof through the transparent spacing layer on the base substrate has a length less than or equal to d5+d4$_3$.

As described above, the wavelength converting layer of the present disclosure may also comprise a transparent color filtering unit. The sub-pixel having a transparent color filtering unit is used to make the light emitted by the light emitting unit output directly without wavelength conversion. For a sub-pixel having a wavelength converting unit and a neighboring sub-pixel having a transparent color filtering unit, the status of the cross color therebetween is as follows.

Figure 9:
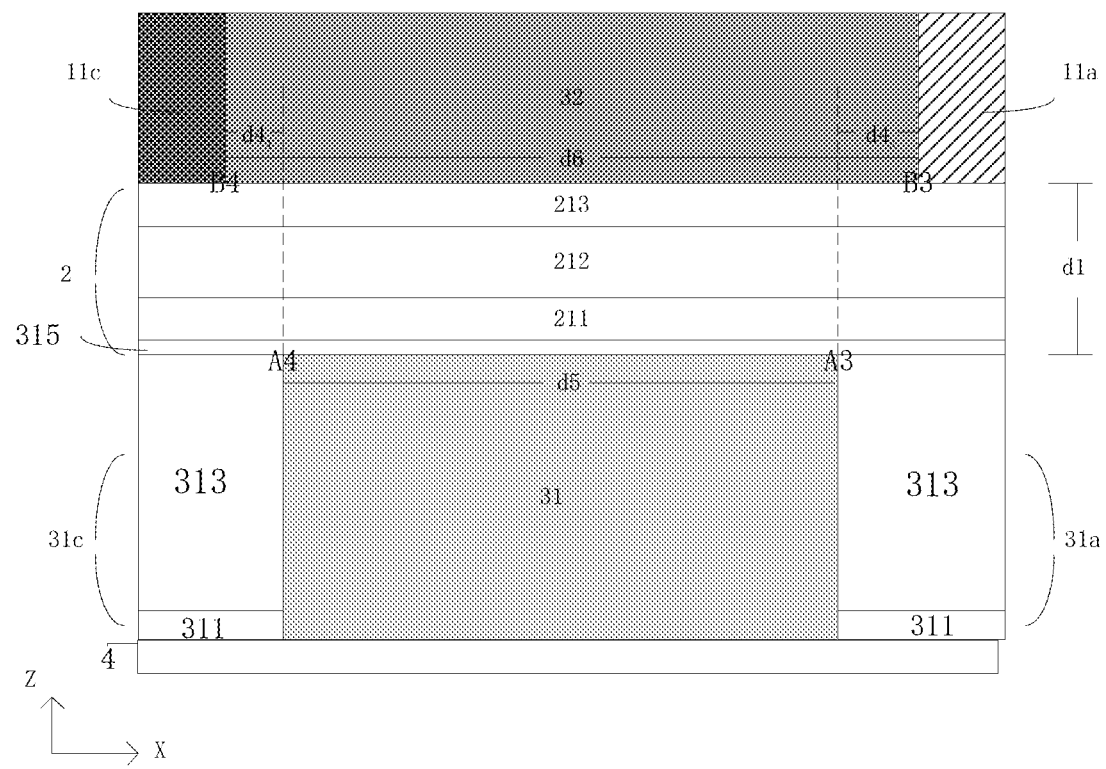
FIG. 9 schematically shows the structure between two adjacent sub-pixels in an embodiment of the present disclosure.

FIG. 9 schematically shows the structure between two adjacent sub-pixels c and a in an embodiment of the present disclosure. The first sub-pixel a comprises a light emitting unit 31a and a wavelength converting unit 11a, and the third sub-pixel c comprises a light emitting unit 31c and a wavelength converting unit 11c. The components such as transparent spacing layer, the light emitting unit, the first pixel defining layer and the second pixel defining layer in FIG. 9 are similar to those in FIG. 6(b).

Differently from FIG. 6(b), the light from the A3 point of the first sub-pixel to the B4 point enters into the transparent color filtering unit 11c. Because the transparent color filtering unit 11c has no wavelength converting particles, even if it contains scattering particles, the light from the A3 point of the first sub-pixel to the B4 point will not obviously produce luminescence at the front surface of the display panel. In other words, the cross color level from the first sub-pixel to the third sub-pixel without wavelength conversion may be neglected, and is not necessary to be limited by special geometric parameters. In this case, the distance $d4_4$ may also be not particularly limited. Of course, $d4_4$ may also be limited by adopting the concept of the present disclosure based on relative luminance.

Nevertheless, the light from the A4 point to the B3 point still causes the risk of cross color, and is necessary to be limited by employing the principle of the present disclosure. In this case, the transparent color filtering unit does not converting the wavelength of the light emitted by the light emitting unit, but will still change the luminance of the light due to the luminance change ratio for the material, wherein the luminance change ratio is rc. rc is a value always less than 100%. Accordingly, when the aforementioned critical value p for the relative luminance is selected, the critical emergence angle as corresponding to the critical leakage intensity proportion of the light from the light emitting unit 31c of the third sub-pixel to the wavelength converting unit 11a of the first sub-pixel may be calculated from the p, ra, and rc. The preferred range of the critical value for the relative luminance for preventing cross color is the same as above.

Generally, the widths of the top surfaces of the pixel defining layers between the sub-pixels are the same, because the light emitting units typically have the same size and dimension, and are uniformly distributed. In other words, the geometric parameters may be designed such that d5=d2.

According to the previous process, particular geometric structure of the layers in a display panel having sub-pixels with three colors may be designed.

In an embodiment, the light emitting unit emits blue light. The third sub-pixel comprises a transparent color filtering unit and is a blue sub-pixel, the first sub-pixel is a red sub-pixel. And the second sub-pixel is a green sub-pixel, such that the RGB color display may be achieved.

In an embodiment, the transparent color filtering unit has a luminance change ratio within [60%, 85%].

In an embodiment, ra is within [110%, 180%], and rb is within [25%, 70%]. The luminance change ratio is related to parameters such as the wavelength of the emitted light, the wavelength after the conversion and the external quantum efficiency of the photoluminescent material, and has a large fluctuation range. Typically, the luminance change ratio from blue light to green light is in a range from 25% to 70%, and the luminance change ratio from blue light to red light is in a range from 110% to 180%. Based on such ranges, x1 and x2 may be calculated, then $\alpha_1$ and $\alpha_2$ may be calculated, and in turn, desired $d2+d4_1$ and $d2+d4_2$ may be calculated.

As an example, in cadmium selenide-based quantum dots, the luminance change ratio for red quantum dot may be about 40%, and the luminance change ratio for green quantum dot may be about 170%. In indium phosphide-based quantum dots, the luminance change ratio for the red quantum dot may be about 23%, and the luminance change ratio for the green quantum dot may be about 110%.

In an embodiment, for example, the luminance change ratio for the red sub-pixel may be about 120%, the luminance change ratio for the green sub-pixel may be about 60%, and the luminance change ratio for the transparent color filtering unit or the light scattering unit may be about 80%. All critical values p are assumed to be 3%. Because the blue sub-pixel has no wavelength converting unit, no photoluminescence will occur therein. Therefore, the cross color caused by the light emitted by the red sub-pixel and the green sub-pixel to the blue sub-pixel will not likely occur. However, between adjacent red, green and blue sub-pixels, because the red sub-pixel has a large luminance change ratio, and the green sub-pixel has the smallest luminance change ratio, the cross color caused by the light emitted by the green sub-pixel to the red sub-pixel is the most obvious. In this case, if it is assumed that the red sub-pixel is the first sub-pixel and the green sub-pixel is the second sub-pixel, then x1% is about 3%×(120%/60%)=6%, and x2% is about 3%×(60%/120%)=1.5%. Accordingly, for example, according to the previous table, the angle corresponding to $\alpha_1$ is about 76°, and the angle corresponding to $\alpha_2$ is about 82°, for example. In this case, the minimum of $d4_1$ will be greater than that of $d4_2$. In this case, the lateral distance between the top surface of the light emitting unit of any sub-pixel and the bottom surface of the wavelength converting unit or the transparent color filtering unit of the neighboring sub-pixel may be set to be the $d2+d4_1$ corresponding to 82°. In other words, as long as the light emitted by the green sub-pixel will not cause obvious cross color to the red sub-pixel, any other cross color may be avoided.

It should be understood that the above exemplary parameters are only intended for describing, but not limiting the present disclosure.

Figure 10:
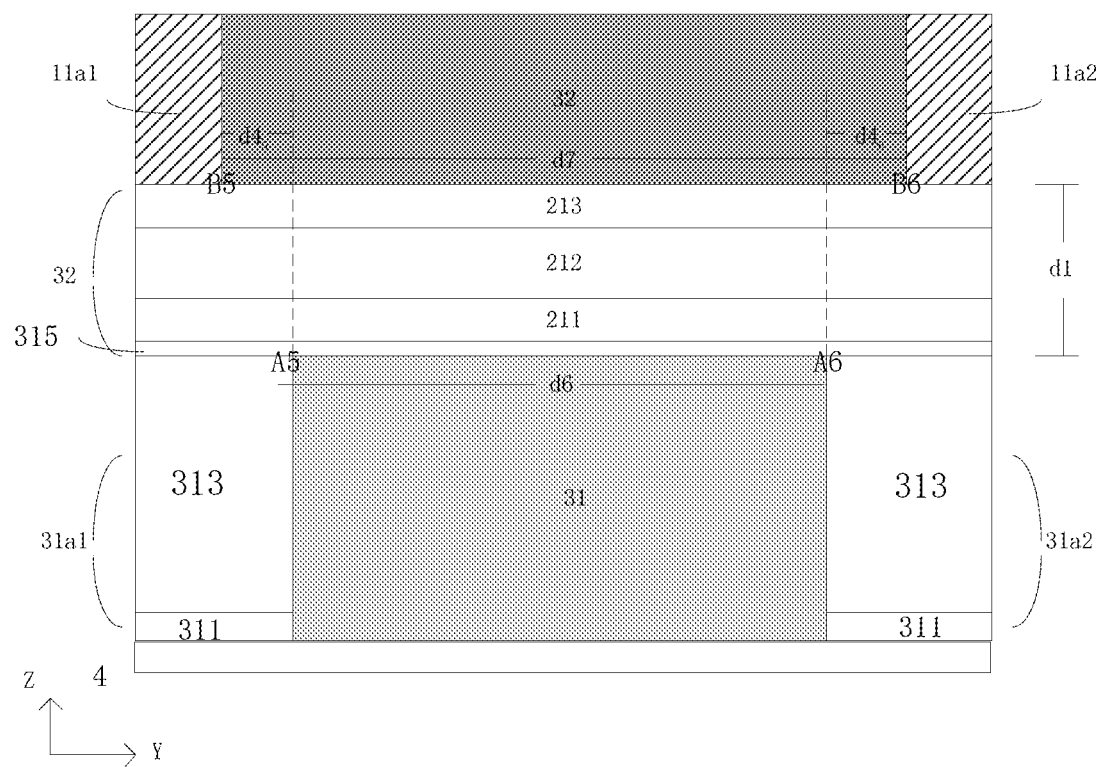
FIG. 10 shows the section in the Y-Z plane of FIG. 2.

In the embodiments, the design of the present disclosure may also be used in adjacent sub-pixels with the same color. For example, in the Y direction in FIG. 2, adjacent sub-pixels with the same color are arranged. Although the cross talk between the sub-pixels with the same color will not cause color change, it will influence the display. FIG. 10 shows the section in the Y-Z plane of FIG. 2. Because two adjacent sub-pixels a1, a2 have the same color, $d4_5$ and $d4_6$ may be equal. Furthermore, equivalently, the conversion rates are equal. Also, with respect to the second sub-pixel has a wavelength converting unit in the Y direction, the conversion rates of adjacent sub-pixels are also equal. Therefore, with respect to the first and second sub-pixels, the critical light intensity proportions are equal. When the adjacent sub-pixels have the same color, the proportion may be selected to be slightly larger, for example 5%, but the previous range up to p and preferred range may be also selected. The parameters are the same between the first sub-pixels and between the second sub-pixels. With respect to the third sub-pixels having a transparent color filtering unit, for example, because the cross talk is not obvious, the geometric structure therebetween may be not limited, but preferably are the same as the first and second sub-pixels in size.

In an embodiment, the wavelength converting unit comprises quantum dots. In other word, the wavelength converting unit may be a quantum dot wavelength converting unit. More preferably, the light emitting unit is an OLED. Thus, a QD-OLED display panel is formed.

In an embodiment, the transparent spacing layer comprises a first inorganic layer, an organic layer and a second inorganic layer from bottom to top. The inorganic-organic-inorganic transparent spacing layer may be used as an encapsulation layer for encapsulating the light emitting layer, providing good overall mechanical property and protection from outside, and providing a substrate for the preparation of subsequent second pixel defining layer, wavelength converting layer or transparent layer, or serving to prepare the alignment with separately prepared wavelength converting layer.

In an embodiment, the first inorganic layer may be a SiNx layer, and the second inorganic layer may be a SiONx layer or an $Al_2O_3$ layer. A good encapsulation effect may be achieved by sandwiching an organic layer between such first inorganic layer and second inorganic layer. The material and thickness of the inorganic layer may be adjusted as appropriate, and should take the protection, the thickness and the strength of itself into consideration.

The organic layer typically has a smaller refractive index than the inorganic layers above and below it, such that light travels at a large angle therein, resulting in very large optical distance desired. Reduction in the thickness of the organic layer facilitates reduction in the distance between adjacent sub-pixels, thereby improving the resolution.

As described above, typically, a transparent cathode is used as a common electrode to cover the first pixel defining layer. It should be understood that there may be film layers such as an electron injection layer, an electron transport layer and a hole blocking layer between the transparent cathode and the light emitting material layer of the light emitting unit. If these film layers are formed on the entire surface of the first pixel defining layer, they may also serve as a portion of the transparent spacing layer. If these film layers are formed between the first pixel defining layers, then they belong to separate light emitting units.

Common materials in related art may be used for the transparent cathode. As described above, the metal transparent cathode has a thickness much smaller than that of the transparent spacing layer, so it may be neglected in the previous equation for calculating the lateral light path distance from the refractive index and the film layer thickness.

In an embodiment, the organic layer has a thickness in a range from 4 to 8 μm. Such thickness is less than a conventional thickness in related art, facilitating reduction in the optical distance. The organic layer with this thickness may be formed, for example, by ink jet printing. With this thickness, according to the principle of the present disclosure, a display panel without cross color and having a high resolution may be obtained.

In an embodiment, the organic layer has a thickness in a range from 0.3 to 0.6 μm. Such thickness is much less than a conventional thickness in related art, facilitating substantial reduction in the optical distance and substantial increase in the resolution. Such thin-layer organic layer may be formed, for example, by molecular layer deposition.

For example, in an exemplary embodiment, the first inorganic layer is SiN with a thickness in a range from 0.6 to 1.2 μm, the organic layer is an organic filling layer with a thickness in a range from 4 to 8 μm, and the second inorganic layer is SiON with a thickness in a range from 0.6 to 1.2 μm.

Also, for example, in an exemplary embodiment, the first inorganic layer is SiN with a thickness in a range from 0.4 to 0.7 μm, the organic layer is an organic layer with a thickness in a range from 0.3 to 0.6 μm, and the second inorganic layer is $Al_2O_3$ with a thickness in a range from 0.7 to 1.3 μm.

Figure 11:
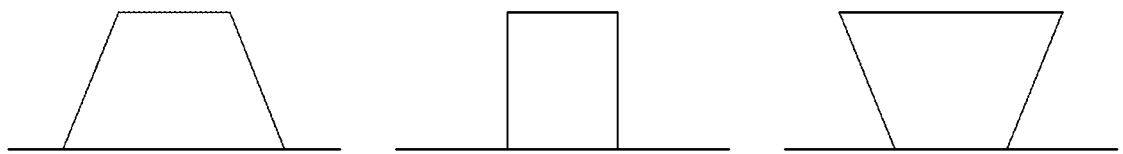
FIG. 11 shows exemplary shapes of the second pixel defining layer.

In the present disclosure, the bottom surface of the wavelength converting unit or the transparent color filtering unit is confined by the bottom of the second pixel defining layer. FIG. 11 shows several common exemplary shapes of the second pixel defining layer, including substantially regular trapezoidal shape, substantially rectangular shape, and substantially inverse trapezoidal shape. The regular trapezoidal shape means that the edge on a side close to the base substrate is longer, and the inverse trapezoidal shape means that the edge on a side close to the light-exiting side is longer. Of course, the second pixel defining layer may also be asymmetric. However, from the perspective of convenient preparation, a symmetric second pixel defining layer is preferred.

For the second pixel defining layer with such a shape, the boundaries of the interface between the second pixel defining layer and the transparent spacing layer are the boundaries between the second pixel defining layer and the wavelength converting units or the transparent color filtering units on both sides, and define its bottom surface.

In an embodiment, the top surface of the second pixel defining layer has a width less than that of a bottom surface thereof. The light-exiting surface of the wavelength converting layer between the second pixel defining layers is large than the light-incoming surface, facilitating the display.

In an embodiment, the second pixel defining layer of the present disclosure may comprise a main body and a coating layer on a side wall of the main body. The additional coating layer on the main body may provide various advantages for the wavelength converting unit.

Figure 12:
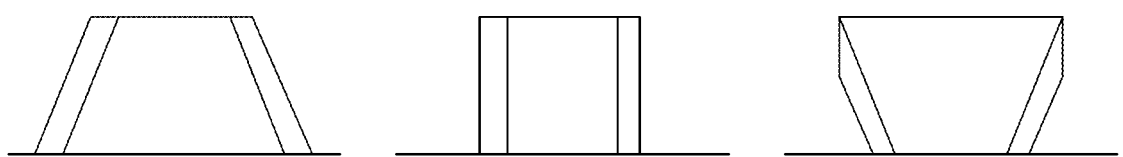
FIG. 12 shows schematic diagrams of the second pixel defining layer with an ink permeation preventing layer on its side wall.

FIG. 12 shows schematic diagrams of the second pixel defining layer with a coating layer on its side wall.

The wavelength converting layer such as the QD wavelength converting layer is generally prepared by an ink jet printing process. In an On EL type route, it is necessary to fabricate a low temperature cured second pixel defining layer pattern on the encapsulation layer, because the light emitting unit is not resistant to high temperature, and the problems of reduced luminescence efficiency and lifetime will occur when the temperature exceeds 100° C. However, because the low temperature cured material for the second pixel defining layer is cured at a low temperature, there are still a large amount of voids and holes inside, such that ink easily permeates into one pixel from another pixel, resulting in color mixing. Due to the ink permeation, a swelling effect of the second pixel defining layer will occur, and the overall width becomes larger, resulting in reduced pixel aperture ratio. In order to prevent the swelling effect of the second pixel defining layer and the ink permeation to the neighboring pixel, an ink permeation preventing layer may be provided on the side wall of the original second pixel defining layer. In this case, the second pixel defining layer comprises a main body and an ink permeation preventing layer provided on the side wall thereof.

The coating layer may also be a reflecting layer containing a reflecting material. The coating layer may also be an absorption layer containing a light absorbing material (for example, metal molybdenum; or a resin doped incorporating a black pigment, wherein the black pigment may be one or more of aniline black, perylene black, titanium black, carbon black, metal oxides). The presence of the reflecting layer may render the converted light and non-converted light incident onto the side wall of the second pixel defining layer to enter into the wavelength converting unit again, enhancing the light-exiting efficiency. When the reflecting material or light absorbing material forms a lateral extending portion as described below on the top surface of the transparent spacing layer, it may function to shield light.

Preferably, a material for the coating layer is metal. The metal layer has a relatively dense structure, may block a solvent, and has a reflecting effect at the same time. More preferably, the metal used may include, but not limited to, Al, Ti/Al/Ti, Mo and the like, which have excellent compactness for blocking an ink solvent, and reflecting property or light absorbing property.

In an embodiment, the coating layer has a lateral extending portion away from the main body at its bottom which covers the surface of the transparent spacing layer.

Figure 13:
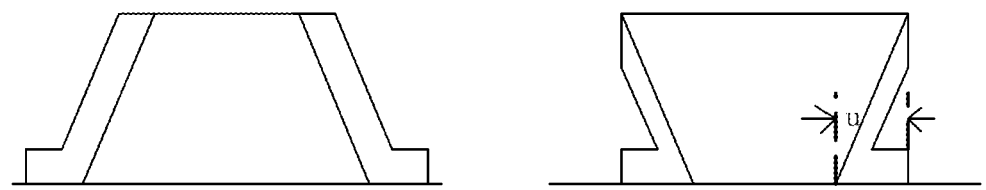
FIG. 13 shows schematic diagrams of the structure with an ink permeation preventing layer extending outwards on its bottom.
Figure 14A:
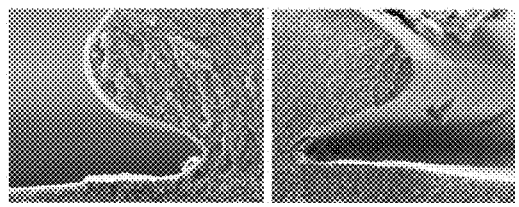
Figure 14B:
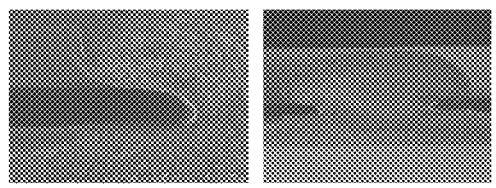

FIG. 13 shows schematic diagrams of the structure with a coating layer extending outwards on its bottom. As can be seen, the ink permeation preventing layer may also be a reflecting layer, which increases the width of the second pixel defining layer at the bottom. Such a design has two advantages as follows. First, without the L-shaped coating layer, if the width of the bottom of the second pixel defining layer is increase as much as possible to avoid cross color, the upper end of the second pixel defining layer will be widened, such that the light emitting area of the wavelength converting layer becomes smaller, or the volume of the wavelength converting layer becomes smaller. However, the L-shaped coating layer may make the wavelength converting layer have a larger volume with the same light-incoming surface, resulting in more sufficient wavelength conversion, and also have a relatively larger light-exiting area, without influencing the resolution. Second, if the L-shaped coating layer is an ink permeation preventing layer, it will enhance the protection for the bottom of the main body, such that it is more difficult for the ink to permeate into the relatively weak bottom.

In a more preferred embodiment, the main body has an undercut, and the coating layer not only covers the side wall, but also covers the top surface of the transparent spacing layer at the undercut, as shown in the right portion in FIG. 13.

The undercut means that the bottom of the second pixel defining layer is concave relative to the top, wherein the bottom is on a side close to the base substrate, while the top is on a side away from the base substrate. Typically, the inverse trapezoidal shape has an undercut. Although it is desirable to for a trapezoidal section, in a practically manufactured product, the shape of the section often has some variations from a standard trapezoid due to the limitations of the material and process for the second pixel defining layer. The top angle of an inverse trapezoid is often not a sharp acute angle, but a rounded angle. Even more, the aforementioned mushroom-shaped section is formed in practical production, which has two rounded top angles, and the depth of the undercut at the root portion is somewhat decreased. It should be noted that if allowed in the process, the variation of the product from trapezoid should be avoided as much as possible, that is, the standard trapezoid is more desirable.

The advantage of the L-shaped ink permeation preventing layer provided in the undercut lies in that it may be conveniently prepared by sputtering on a low temperature cured second pixel defining layer and then dry etching. Specifically, the second pixel defining layer is fabricated by the following processes: performing a photocuring to obtain a main body with an undercut, sputtering depositing a covering protection layer, and then removing the protection layer on the top surface of the main body and the protection layer on the portion other than the undercut.

FIGS. 14(a)-(d) show SEM photos of the structure having an undercut and a metal ink permeation preventing layer on its side wall. Here, all the metal ink permeation preventing layers are aluminum layers, and the aluminum layers in FIGS. 14(a)-(d) have thicknesses of 2000 Å, 3000 Å, 4000 Å and 6000 Å in sequence respectively. As can be seen, the metal Al has a thickness between 2000 and 6000 Å. After dry etching, the thickness of Al varies, and the morphology and shielding range of the reflecting metal remaining on the side wall of the second pixel defining layer also vary. According to the principle coating as much as possible and preventing ink permeation, the thickness of Al is suitably 2000-4000 Å, and the same is suitable for other metals.

A plurality of metals may be selected. For the reflectivity for visible light, in a descending order, Ti/Al/Ti>Al>Mo. However, because Al is easily oxidized to $Al_2O_3$, reducing the reflectivity, the material is preferably Ti/Al/Ti or Ti metal.

Preferably, the undercut has a depth in the range of [4 μm, 9 μm]. The undercut depth is the distance between the projections of the edge of the top surface and the edge of the bottom surface on the base substrate, for example, the distance u as shown in the right portion of FIG. 13. Such an undercut depth may be formed by photocuring. when the main body has a substantially inverse trapezoidal shape, the angle between its side surface and bottom surface is preferably between 95° and 140°. Such an angle maintains the strength of the main body and keeps a suitable amount of space for the ink permeation preventing layer at the undercut.

The process for forming a display panel may comprise a cell alignment process and an on-EL process. The cell alignment process refers to a process where the light emitting layer and the wavelength converting layer are formed separately, and then they are assembled with cells aligned. The on-EL process is to prepare the wavelength converting layer on the basis of the light emitting layer in a layer by layer manner. The display panel of the present disclosure may be formed by simultaneously using both forming processes. Furthermore, the processes for preparing the wavelength converting unit/the transparent color filtering unit may comprise an ink jet printing process and a lithographic process.

The above description of the present disclosure is based on an ideal flat shape. For example, the shapes in the sectional view are all rectangle or trapezoid. Ideally, the top surfaces of the first pixel defining layers are planar surfaces, and the top surface of the light emitting unit between them is a planar surface which is aligned with them; the bottom surfaces of the second pixel defining layers are planar surfaces, and the bottom surface of the wavelength converting unit is a planar surface which is aligned with them; and the bottom surface and the top surface of the transparent spacing layer are also planar surfaces accordingly. Furthermore, the side walls of these structures are also planar. In practical production, all the above surfaces may be not an ideal planar surface, and the side walls of these structures may also be not planar. However, these surfaces should not have too large unevenness. When these surfaces only have slight unevenness relative to an ideal shape, the surfaces thereof are fitted to a planar surface to determine the previous parameters.

The present disclosure also provides a display panel comprising a color film layer. The display panel of the present disclosure may further comprise a color film layer to provide better color display effect. The color film layer is provided on the wavelength converting layer. For example, red, green and blue color filtering units are provided at respective positions corresponding to red, green and blue sub-pixels.

FIG. 15 shows a schematic diagram of an embodiment of a QD-OLED display panel according to the present disclosure further comprising a color film layer. Here, a color film layer 6 and an outer protection encapsulation layer 5 are overlaid on the wavelength converting layer 3. The color film layer 6 may comprise a black matrix BM and color films with various colors defined by the BM. 31 represents an OLED light emitting unit, 11R and 11G represent red and green wavelength converting units respectively, 11B represents a transparent color filtering unit, and 61R, 61G and 61B represent red, green and blue color films respectively.

FIG. 15 only shows an exemplary basic structure. Specifically, the transparent spacing layer 2 may comprise an encapsulation layer for the light emitting layer and an encapsulation layer for the wavelength converting layer, and may also comprise a filling layer and supporting pillars between the light emitting layer and the wavelength converting layer. The encapsulation layer facilitates the cell alignment assembling of the wavelength converting layer. FIG. 15 is only intended to illustrate the position relationship between various components, but not to limit particular shapes and details of them.

FIG. 16 shows an embodiment of a related structure of the light emitting layer. The figure shows a partial schematic diagram of a structure comprising 3 complete OLED light emitting units and 4 PDL-1s. A buffer layer BUF is provided on the base substrate BS. On the buffer layer, each sub-pixel is provided with a TFT unit. The TFT unit comprises a source electrode S, a drain electrode D, a gate electrode G, and an active layer ACT. A first gate electrode insulating layer GI1 is provided below the gate electrode and between the gate electrode and the active layer, and a second gate electrode insulating layer GI2 is overlaid on the gate electrode and its periphery. An interlayer dielectric layer ILD and a planarization layer PLN are provided in sequence on the second gate electrode insulating layer. Enable signal wires Ce1 and Ce2 are further provided on the second insulating layer and the interlayer dielectric layer. A light emitting unit is formed on the planarization layer between the first pixel defining layers PDL-1. The light emitting unit comprises an anode AD, an organic light emitting portion EL and a cathode CD from bottom side to top side. The anode is connected to the drain electrode of the TFT, and the cathode is a common electrode. A first encapsulation layer Encap-1 is further provided on the cathode. The first encapsulation layer is disposed on a side of the light emitting layer close to the wavelength converting layer. FIG. 16 schematically shows that the PDL-1s are walls having a trapezoidal vertical section. It should be understood that they form a network on the array substrate, and define a plurality of spaces for accommodating the light emitting units. The structure of the OLED light emitting unit as described above is known in the art, and comprises an anode, an organic light emitting layer, a cathode, and so on. In FIG. 16, the anode AD of the light emitting unit may be a reflecting anode which reflects the light emitted by the OLED to the top surface to increase the light-exiting efficiency. Furthermore, in contrast to the multi-color OLED array, the light emitting layer of the present disclosure only has a light emitting material layer with one color, and thus may be formed on the entire surface with an open mask without forming the sub-pixels one by one by using a fine metal mask, for example. A projection of the TFT on the base substrate may be overlapped with both the PDL-1 and the light emitting unit. That is, one portion of the TFT may also be positioned below the PDL-1, and another portion may be positioned below the reflecting anode.

The present disclosure provides a method for manufacturing the display panel described above, wherein the second pixel defining layer is fabricated by steps of:
  providing a main body having an undercut;
  sputtering depositing a coating layer on surfaces of the transparent spacing layer and the main body; and
  removing the coating layer on a top surface of the main body and the coating layer on the transparent spacing layer where it is not shielded by the top surface of the main body by dry etching, and remaining the coating layer on the side wall and in the undercut of the main body.

For a display panel having an undercut, an L-shape coating layer as schematically shown in the right portion of FIG. 13 may be easily obtained by the above sputtering-dry etching process. In an embodiment, a metal such as Al, Ti/Al/Ti, Mo and the like is deposited on the second pixel defining layer at room temperature by sputtering, and then vertically etched by dry etching. The side wall of an inverse trapezoid may provide effective shielding to remain the metal on the side wall, and the metals both on the top of the inverse trapezoid and inside the pixel are etched off. No metal is on the top of the inverse trapezoid, such that the reflection of an environmental light may be prevented. Then, a hydrogen fluoride plasma bombarding is performed to modify the surface of the top of the second pixel defining layer, such that the top of the second pixel defining layer has a hydrophobic and lipophilic surface property, which is convenient for subsequent printing process.

In an embodiment, the main body having an undercut is obtained by low temperature curing a black material. In the process for preparing an On-EL, the wavelength converting layer is directly formed on the substrate of the light emitting layer and the transparent spacing layer. Therefore, in order to prevent the light emitting unit below from being damaged due to high temperature, the use of a low temperature cured second pixel defining layer is advantageous. However, because the low temperature cured material is cured at a low temperature, there are still a large amount of voids and holes inside, such that ink easily permeates into one pixel from another pixel in an ink jet printing process, resulting in color mixing. A swelling effect of the material for the second pixel defining layer will occur, and the overall width becomes larger, resulting in reduced pixel aperture ratio.

With respect to this problem, the use of a low temperature cured black material is particularly advantageous, because during the curing, the bottom is poorly cured due to the light shielding by the black color, thereby forming an undercut naturally. The undercut is convenient for forming an L-shaped coating layer, and after forming the L-shaped coating layer, the ink permeation may be effectively blocked.

Therefore, by using a low temperature cured black material to obtain a main body having an undercut, the light emitting unit is protected, while the L-shaped coating layer may be conveniently formed, overcoming the void issue. Furthermore, the edge of the L-shaped coating layer in the undercut, i.e., the boundary of the wavelength converting unit, may be easily defined in a dry etching process by the width of the top of the second pixel defining layer itself, without any patterning process such as a mask with high accuracy. This avoids the problem that the lateral extending distance cannot be easily control when the L-shaped coating layer of FIG. 13 is used.

In an embodiment, the transparent spacing layer comprises an organic layer fabricated by a molecular layer deposition process. As compared to a coating process or an ink jet printing process, a much thinner organic layer may be obtained by a molecular layer deposition process. Because an organic material typically has a low refractive index, the ultra-thin organic layer may obviously reduce the lateral optical distance of the light in the emergent light path at a critical angle as described in the present disclosure, such that the bottom surface of the second sub-pixel may be much narrower, thereby obtaining a higher resolution.

In another embodiment, the present disclosure also provides a display device comprising the display panel of the present disclosure, which may have a good cross color preventing property.

The present disclosure will be further described with reference to particular examples below, but the present disclosure is not limited to the following examples.

EXAMPLE 1

The device prepared in the present example is a structure comprising a blue OLED and a QD wavelength converting unit superimposed thereon, in an On EL route. A TFT, a light emitting unit and a QD wavelength converting unit were fabricated on a substrate. In the present example, the encapsulation layer of the light emitting unit has a three layer encapsulation structure, with a thickness of about 10 μm.

The back plate has a stacked structure of a TFT layer, a PNL layer, an anode ITO/Ag/ITO layer, a first pixel defining layer, a blue light emitting layer, a cathode layer, a thin film encapsulation layer, a low temperature second pixel defining layer, a reflecting metal layer on the side wall of the second pixel defining layer, a QD wavelength converting unit layer, a low temperature color film layer, a low temperature OC layer, and a white glass cover plate in this order.

The substrate was washed by a standard process; and the procedure for preparing the TFT was performed.

A layer of ITO/Ag/ITO with a thickness of 80/1000/120 Å was deposited by sputtering. A layer of photoresist material was applied by spin coating. The ITO/Ag/ITO layer was patterned by processes such as prebaking, exposing, developing and wet etching.

A layer of the material for the first pixel defining layer was applied by spin coating. A first pixel defining layer was prepared by adjusting the process conditions for prebaking, exposing, developing, postbaking and ashing, with a thickness in a range from 0.5 to 2.0 μm and a top width of 50 μm.

A blue OLED light emitting layer was prepared by evaporation deposition.

A MgAg cathode layer of 80 to 120 Å was prepared by using a sputtering apparatus.

A thin film encapsulation layer SiNx of 1 μm, an organic layer of 8 μm, and SiON of 1 μm were fabricated by PECVD and ink jet printing (IJP), with refractive indexes of 1.9, 1.5 and 1.8 respectively.

Low temperature black material for the main body of the second pixel defining layer was applied by spin coating. The process conditions for prebaking, exposing, developing and postbaking were adjusted to obtain a BM with a thickness of 10 to 13 μm. The main body of the second pixel defining layer had the same width as the top of the first pixel defining layer when it was patterned, and formed an undercut with a depth of 4 to 9 μm after being cured.

Metal Ti/Al/Ti of 3000 Å was deposited by sputtering, and then etched by an ICP dry etching process to fabricate a reflecting metal layer. The encapsulation layer at the undercut was covered by the reflecting metal layer, so the bottom surface of the second pixel defining layer had the same width as the top surface of the first pixel defining layer.

R/G QD Ink materials and a B pixel scattering particle Ink material were printed by IJP. The process conditions for prebaking, exposing, developing and postbaking were adjusted to obtain a thickness of 10 to 12 μm. The luminance conversion rates of the red and green QD layers on blue light were 2:1.

Low temperature RGB CF materials were applied by spin coating. The process conditions for prebaking, exposing, developing, and postbaking were adjusted to obtain a thickness of 2 μm.

Low temperature and low refractive index OC material (with a refractive index of 1.4) for the outer protection layer was applied by spin coating. The process conditions for prebaking, exposing, developing, and postbaking are adjusted to obtain a thickness of 2.0 μm.

A white glass cover plate was used for encapsulating.

According to the equation $x1\% = p \times (½) = 1.55\%$, the light path is calculated depending on the refractive indexes of the encapsulated layers, and the total reflected portions are removed. Starting from the bottom of the encapsulation layer, the light with an emergence angle of about 52° or more will be totally reflected at the interface between the SiON and the organic layer, and cannot enter into the organic layer from the SiON. Therefore, when considering $x1\%$, only the portion with an initial emergence angle of 0-52° is taken into consideration. After test, in the present example, the intensity of the light with an emergence angle between 51° and 52° accounts for about 1.55% of the total intensity of the light with an emergence angle between 0° and 52°. According to calculation based on an emergence angle of 51°, the lateral traveling distance of the light in the SiON layer with a thickness of 1 μm is 1.2 μm. When the light enters into the organic layer, the emergence angle is about 80°, and the lateral traveling distance of the light in the organic layer with a thickness of 8 μm is 45.4 μm. After the light enters into the SiNx layer, the emergence angle becomes 55°, and the lateral traveling distance of the light in the SiNx with a thickness of 1 μm is 1.4 μm. Thus, according to calculation, the total lateral traveling distance is 48 μm, which is less than the width (50 μm) of the bottom surface of the second pixel defining layer, and thus the light cannot arrive at the wavelength converting unit of the neighboring sub-pixel.

According to the embodiment of the present disclosure, the prevention of cross color may be achieved in a structure without providing an additional vertical light blocking layer.

EXAMPLE 2

The device prepared in the present example is a structure comprising a blue OLED and a QD wavelength converting unit superimposed thereon, in an On EL route. A TFT, a light emitting unit and a QD wavelength converting unit were fabricated on a substrate. In the present example, the encapsulation layer of the light emitting unit has a three layer encapsulation structure, with a thickness of about 2 μm. In this structure, the film layers were made denser by using molecular layer deposition and atom layer deposition apparatuses. The EL encapsulation layer was optimized to reduce its thickness while ensuring the reliability. According to the previous size design calculation, as compared to Example 1, the designed aperture ratio may be increased by 60% or more in the present example.

The back plate has a stacked structure of a TFT layer, a PNL layer, an anode ITO/Ag/ITO layer, a first pixel defining layer, a blue light emitting layer, a cathode layer, a thin film encapsulation layer, a low temperature second pixel defining layer, a reflecting metal layer on the side wall of the second pixel defining layer, a QD wavelength converting unit layer, a low temperature color film layer, a low temperature OC layer, and a white glass cover plate in this order.

The substrate was washed by a standard process; and the procedure for preparing the TFT was performed.

A layer of ITO/Ag/ITO with a thickness of 80/1000/120 Å was deposited by sputtering. A layer of photoresist material was applied by spin coating. The ITO/Ag/ITO layer was patterned by processes such as prebaking, exposing, developing and wet etching.

A layer of the material for the first pixel defining layer was applied by spin coating. A first pixel defining layer was prepared by adjusting the process conditions for prebaking, exposing, developing, postbaking and ashing, with a thickness in a range from 0.5 to 2.0 μm and a top width of 8 μm.

A blue OLED light emitting layer was prepared by evaporation deposition.

A MgAg cathode layer of 80 to 120 Å was prepared by using a sputtering apparatus.

A thin film encapsulation layer SiN of 0.4 to 0.7 μm, an organic layer of 0.3 to 0.6 μm, and $Al_2O_3$ of 1 μm were fabricated by PECVD, molecular layer deposition (MLD) and atomic layer deposition (ALD).

Low temperature black material for the main body of the second pixel defining layer was applied by spin coating. The process conditions for prebaking, exposing, developing and postbaking were adjusted to obtain a BM with a thickness of 10 to 13 μm. The main body of the second pixel defining layer had the same width as the top of the first pixel defining layer when it was patterned, and formed an undercut with a depth of 4 to 9 μm after being cured.

Metal Ti/Al/Ti of 3000 Å was deposited by sputtering, and then etched by an ICP dry etching process to fabricate a reflecting metal layer. The encapsulation layer at the undercut was covered by the reflecting metal layer, so the bottom surface of the second pixel defining layer had the same width as the top surface of the first pixel defining layer.

R/G QD Ink materials and a B pixel scattering particle Ink material were printed by IJP. The process conditions for prebaking, exposing, developing and postbaking were adjusted to obtain a thickness of 10 to 12 μm. The luminance conversion rates of the red and green QD layers on blue light were 2:1.

Low temperature RGB CF materials were applied by spin coating. The process conditions for prebaking, exposing, developing, and postbaking were adjusted to obtain a thickness of 2 μm.

Low temperature and low refractive index OC material (with a refractive index of 1.4) for the outer protection layer was applied by spin coating. The process conditions for prebaking, exposing, developing, and postbaking were adjusted to obtain a thickness of 2.0 μm.

A white glass cover plate was used for encapsulating.

Similar to Example 1, it is demonstrated that the total lateral traveling distance of the emergent light at a critical angle corresponding to the luminous intensity proportion of 1.55% from the bottom surface of the transparent spacing layer is less than 4 μm, which is less than the width (8 μm) of the bottom surface of the second pixel defining layer, and thus the light cannot arrive at the wavelength converting unit of the neighboring sub-pixel.

The cross color preventing effect may be achieved with a good resolution by greatly reducing the thickness of the low refractive index organic layer in the transparent spacing layer through molecular layer deposition.

EXAMPLE 3

The device prepared in the present example is a structure comprising a blue OLED and a QD wavelength converting unit superimposed thereon, in an On EL route. A TFT, a light emitting unit and a QD wavelength converting unit were fabricated on a substrate. In the present example, the encapsulation layer of the light emitting unit has a three layer encapsulation structure, with a thickness of about 10 μm. The cross section of the second pixel defining layer appears to be a regular trapezoidal shape, and this structure is more beneficial for light-exiting.

The back plate has a stacked structure of a TFT layer, a PNL layer, an anode ITO/Ag/ITO layer, a first pixel defining layer, a blue light emitting layer, a cathode layer, a thin film encapsulation layer, a low temperature second pixel defining layer, a reflecting metal layer on the side wall of the second pixel defining layer, a QD wavelength converting unit layer, a low temperature color film layer, a low temperature OC layer, and a white glass cover plate in this order.

The substrate was washed by a standard process; and the procedure for preparing the TFT was performed.

A layer of ITO/Ag/ITO with a thickness of 80/1000/120 Å was deposited by sputtering. A layer of photoresist material was applied by spin coating. The ITO/Ag/ITO layer was patterned by processes such as prebaking, exposing, developing and wet etching.

A layer of the material for the first pixel defining layer was applied by spin coating. A first pixel defining layer was prepared by adjusting the process conditions for prebaking, exposing, developing, postbaking and ashing, with a thickness in a range from 0.5 to 2.0 μm and a top width of 8 μm.

A blue OLED light emitting layer was prepared by evaporation deposition.

A MgAg cathode layer of 80 to 120 Å was prepared by using a sputtering apparatus.

A thin film encapsulation layer SiON of 1 μm, an organic layer of 8 μm and SiNx of 1 μm were fabricated by PECVD and IJP.

Low temperature black material for the main body of the second pixel defining layer was applied by spin coating. The process conditions for prebaking, exposing, developing and postbaking were adjusted to obtain a BM with a thickness of 10 to 13 μm. The bottom of the second pixel defining layer had the same width as the top of the first pixel defining layer, and the top of the second pixel defining layer had a width of 6 μm, thereby forming a regular trapezoidal section.

Because there was no undercut, metal Ti/Al/Ti of 3000 Å was deposited by sputtering. Then a layer of photoresist was applied by slit coating, exposed and developed. The portion of the photoresist pattern protected the side wall of the metal from being etched, with a protection range of the entire side wall of the trapezoid. Then, the metal was etched by ICP dry etching to remove the metals on the top and inside the pixel, to fabricate a reflecting metal layer on the side wall.

R/G QD Ink materials and a B pixel scattering particle Ink material were printed by IJP. The process conditions for prebaking, exposing, developing and postbaking were adjusted to obtain a thickness of 10 to 12 μm. The luminance conversion rates of the red and green QD layers on blue light are 2:1.

Layer of low temperature RGB color film materials was applied by spin coating. The process conditions for prebaking, exposing, developing, and postbaking were adjusted to obtain a thickness of 2 μm.

Layer of low temperature and low refractive index OC material (with a refractive index of 1.4) for the outer protection layer was applied by spin coating. The process conditions for prebaking, exposing, developing, and postbaking were adjusted to obtain a thickness of 2.0 μm.

A white glass cover plate was used for encapsulating.

Similar to Example 1, it is demonstrated that the emergent light at a critical angle corresponding to the luminous intensity proportion of 1.55% from the bottom surface of the transparent spacing layer cannot arrive at the wavelength converting unit of the neighboring sub-pixel.

The wavelength converting unit having a width at its top surface greater than that at its bottom surface may facilitate light output.

Thus, the present disclosure provides a display panel, comprising a light emitting layer, a transparent spacing layer on the light emitting layer, and a wavelength converting layer on the transparent spacing layer, wherein according to the luminance change ratios of the wavelength converting units of adjacent pixels and the light path property of the transparent spacing layer, the cross color issue in wavelength-conversion type display panels is at least partially solved by controlling the intensity proportions of the light arriving at the wavelength converting units of adjacent sub-pixels within a certain range.

The above descriptions are only particular embodiments of the present disclosure, but the protection scope of the present disclosure is not limited thereto. Within the technical scope disclosed in the present disclosure, one skilled in the art may readily envisage variations and alternatives, and all of them are covered by the protection scope of the present disclosure. Therefore, the protection scope of the present disclosure should be defined by the appended claims.

What is claimed is:

1. A display panel comprising:
   a light emitting layer on a base substrate,
   a transparent spacing layer on the light emitting layer, and
   a wavelength converting layer on the transparent spacing layer,
   wherein the display panel comprises sub-pixels arranged in an array, the sub-pixels arranged in an array comprise a first sub-pixel and a second sub-pixel adjacent to each other, wherein in each of the first sub-pixel and the second sub-pixel, one light emitting unit in the light emitting layer and one wavelength converting unit in the wavelength converting layer are comprised, and the light emitting unit and the wavelength converting unit are stacked and spaced apart by the transparent spacing layer,
   the light emitting units of the first sub-pixel and the second sub-pixel are spaced apart by a first pixel defining layer in the light emitting layer, and have a top surface spacing of d2,
   the wavelength converting unit of the first sub-pixel is a first wavelength converting unit which has a luminance change ratio of ra on light emitted by the light emitting unit, and the wavelength converting unit of the second sub-pixel is a second wavelength converting unit which has a luminance change ratio of rb on light emitted by the light emitting unit, and the wavelength converting units of the first sub-pixel and the second sub-pixel are spaced apart by a second pixel defining layer in the wavelength converting layer,
   in a direction from the first sub-pixel to the second sub-pixel, relative to an orthographic projection of a boundary between a top surface of the light emitting unit of the second sub-pixel and the first pixel defining layer between the light emitting units of the first sub-pixel and the second sub-pixel on the base substrate, an orthographic projection of a boundary between a bottom surface of the second wavelength converting unit and the second pixel defining layer between the wavelength converting units of the first sub-pixel and the second sub-pixel on the base substrate is shifted by $d4_2$,
   wherein
   in all light which is incident into the transparent spacing layer from the top surface of the light emitting unit and may reach a top surface of the transparent spacing layer, light with an emergence angle of $\alpha_1$ or more has an intensity proportion of x1% or less, wherein x1%=p1×(ra/rb), wherein p1≤5%,
   wherein when light starting from a bottom surface of the transparent spacing layer has an emergence angle of $\alpha_1$, a projection of a light path thereof through the transparent spacing layer on the base substrate has a length less than or equal to $d2+d4_2$.

2. The display panel according to claim 1, wherein p1≤2%.

3. The display panel according to claim 1, wherein when the light starting from the bottom surface of the transparent spacing layer has an emergent angle of $\alpha_1$, a difference between the length of the projection of the light path thereof through the transparent spacing layer on the base substrate and $d2+d4_2$ is less than or equal to 5 μm.

4. The display panel according to claim 1, wherein in a direction from the second sub-pixel to the first sub-pixel, relative to an orthographic projection of a boundary between a top surface of the light emitting unit of the first sub-pixel and the first pixel defining layer between the light emitting units of the first sub-pixel and the second sub-pixel on the base substrate, an orthographic projection of a boundary between a bottom surface of the first wavelength converting unit and the second pixel defining layer between the wavelength converting units of the first sub-pixel and the second sub-pixel on the base substrate is shifted by $d4_1$,
   wherein
   in all light which is incident into the transparent spacing layer from the top surface of the light emitting unit and may reach a top surface of the transparent spacing layer, light with an emergence angle of $\alpha_2$ or more has an intensity proportion of x2% or less, wherein x2%=p2×(rb/ra), wherein p2≤5%,
   wherein when light from a bottom surface of the transparent spacing layer has an emergence angle of $\alpha_2$, a projection of a light path thereof through the transparent spacing layer on the base substrate has a length less than or equal to $d2+d4_1$.

5. The display panel according to claim 4, wherein p2=p1.

6. The display panel according to claim 4, wherein $d4_1=d4_2$.

7. The display panel according to claim 4, wherein $|d4_1|\le 5$ μm, and $|d4_2|\le 5$ μm.

8. The display panel according to claim 1, wherein the transparent spacing layer has a thickness of d1, and comprises m sub-layers stacked bottom up, wherein an i-th sub-layer has a thickness of $L_i$ and a refractive index of $n_i$, wherein i is between 1 and m, parameters meet the following equations:

$$d1 = \sum_{i=1}^{m} L_1$$

$$d2 + d4_2 = \sum_{i=1}^{m} L_i \tan\theta_{1i},$$

wherein i is an integer between 1 and m, $n_i \sin \theta_{1i}$ is a constant, and $\theta_{11}=\alpha_1$.

9. The display panel according to claim 1, wherein the sub-pixels arranged in an array further comprise a third sub-pixel adjacent to the first sub-pixel, wherein in the third sub-pixel, one light emitting unit in the light emitting layer and one transparent color filtering unit in the wavelength converting layer are comprised, and the light emitting unit and the transparent color filtering unit are stacked and spaced apart by the transparent spacing layer, the light emitting units of the first sub-pixel and the third sub-pixel are spaced apart by the first pixel defining layer in the light emitting layer, and have a top surface spacing of d5, the transparent color filtering unit does not convert a wavelength of a light emitted by the light emitting unit, and has a luminance change ratio of re on light emitted by the light emitting unit, and the wavelength converting unit of the first sub-pixel and the transparent color filtering unit of the third sub-pixel are spaced apart by the second pixel defining layer in the wavelength converting layer, in a direction from the third sub-pixel to the first sub-pixel, relative to an orthographic projection of a boundary between a top surface of the light emitting unit of the first sub-pixel and the first pixel defining layer between the light emitting units of the first sub-pixel and the third sub-pixel on the base substrate, an orthographic projection of a boundary between a bottom surface of the first wavelength converting unit and the second pixel defining layer between the wavelength converting unit of the first sub-pixel and the transparent color filtering unit of the third sub-pixel on the base substrate is shifted by $d4_3$, wherein in all light which is incident into the transparent spacing layer from the top surface of the light emitting unit and may reach a top surface of the transparent spacing layer, light with an emergence angle of $\alpha_3$ or more has an intensity proportion of x3% or less, wherein x3%=p3×(rc/ra), wherein p3≤5%, wherein when light starting from a bottom surface of the transparent spacing layer has an emergence angle of $\alpha_3$, a projection of a light path thereof through the transparent spacing layer on the base substrate has a length less than or equal to $d5+d4_3$.

10. The display panel according to claim 9, wherein the light emitting units emit blue light, the third sub-pixel is a blue sub-pixel, the first sub-pixel is a red sub-pixel, and the second sub-pixel is a green sub-pixel.

11. The display panel according to claim 10, wherein ra is within [110%, 180%], rb is within [25%, 70%], and rc is within [60%, 85%].

12. The display panel according to claim 1, wherein the wavelength converting units comprise quantum dots.

13. The display panel according to claim 1, wherein the transparent spacing layer comprises a first inorganic layer, an organic layer and a second inorganic layer stacked bottom up.

14. The display panel according to claim 13, wherein the first inorganic layer is a SiNx layer, the second inorganic layer is a SiONx layer or an $Al_2O_3$ layer, and the organic layer is an epoxy resin layer or a polyacrylic resin layer.

15. The display panel according to claim 13, wherein the organic layer has a thickness in a range from 4 to 8 μm.

16. The display panel according to claim 13, wherein the organic layer has a thickness in a range from 0.3 to 0.6 μm.

17. The display panel according to claim 1, wherein a top surface of the second pixel defining layer has a width less than that of a bottom surface thereof.

18. The display panel according to claim 1, wherein the second pixel defining layer comprises a main body and a coating layer on a side wall of the main body.

19. The display panel according to claim 18, wherein the coating layer is an ink permeation preventing layer.

20. The display panel according to claim 18, wherein the coating layer comprises a light reflecting material or a light absorbing material.

21. The display panel according to claim 18, wherein a material for the coating layer is metal.

22. The display panel according to claim 18, wherein the coating layer has a lateral extending portion away from the main body at its bottom which covers the surface of the transparent spacing layer.

23. The display panel according to claim 22, wherein the main body has an undercut covered by the lateral extending portion of the coating layer.

24. The display panel according to claim 23, wherein the undercut has a depth in a range from 4 to 9 μm.

25. The display panel according to claim 1, further comprising a color film layer on the wavelength converting layer.

26. A method for manufacturing the display panel of claim 1, wherein the second pixel defining layer is fabricated by steps of:
providing a main body having an undercut;
sputtering depositing a coating layer on surfaces of the transparent spacing layer and the main body; and
removing the coating layer on a top surface of the main body and the coating layer on the transparent spacing layer where it is not shielded by the top surface of the main body by dry etching, and remaining the coating layer on the side wall and in the undercut of the main body.

27. The method according to claim 26, wherein the main body having an undercut is obtained by low temperature curing a black material.

28. The method according to claim 26, wherein the transparent spacing layer comprises an organic layer fabricated by a molecular layer deposition process.

29. A display device comprising the display panel according to claim 1.

* * * * *